(12) United States Patent
Lee et al.

(10) Patent No.: US 9,052,425 B2
(45) Date of Patent: Jun. 9, 2015

(54) SILICON SOLAR CELL

(75) Inventors: Kyung-Wook Lee, Ansan-si (KR);
Kyung-Yul Lee, Bucheon-si (KR);
Bong-Yul Lee, Gunpo-si (KR); Wayne H. Choe, Champaign, IL (US)

(73) Assignee: SAMWON FA CO., LTD., Busan (KR)

( * ) Notice: Subject to any disclaimer, the term of this patent is extended or adjusted under 35 U.S.C. 154(b) by 794 days.

(21) Appl. No.: 13/305,059

(22) Filed: Nov. 28, 2011

(65) Prior Publication Data

US 2012/0118373 A1    May 17, 2012

Related U.S. Application Data

(63) Continuation-in-part of application No. 12/864,031, filed as application No. PCT/KR2008/004054 on Jul. 9, 2008, now Pat. No. 8,422,848.

(30) Foreign Application Priority Data

Jan. 29, 2008  (KR) ................. 10-2008-0009148
Nov. 4, 2011   (KR) ................. 10-2011-0114627

(51) Int. Cl.
| | |
|---|---|
| *G02B 6/00* | (2006.01) |
| *G02B 1/00* | (2006.01) |
| *G02B 5/22* | (2006.01) |
| *G02B 5/26* | (2006.01) |
| *H01L 31/0687* | (2012.01) |
| *H01L 31/043* | (2014.01) |
| *H01L 31/056* | (2014.01) |

(52) U.S. Cl.
CPC ...... *G02B 1/005* (2013.01); *G02B 5/22* (2013.01); *G02B 5/26* (2013.01); *H01L 31/0687* (2013.01); *Y02E 10/52* (2013.01); *Y02E 10/544* (2013.01); *H01L 31/043* (2014.12); *H01L 31/056* (2014.12)

(58) Field of Classification Search
CPC .... G02B 6/0038; G02B 6/0053; G02B 5/045; Y02E 10/50; H01L 31/0522
USPC .......... 385/147; 136/256, 261, 243; 362/627, 362/600, 615, 621–624
See application file for complete search history.

(56) References Cited

U.S. PATENT DOCUMENTS

| | | | |
|---|---|---|---|
| 6,583,350 B1 * | 6/2003 | Gee et al. ............. | 136/253 |
| 6,750,393 B2 * | 6/2004 | Wada et al. ........... | 136/256 |

(Continued)

FOREIGN PATENT DOCUMENTS

JP    2001-308354 A    11/2001

OTHER PUBLICATIONS

Rebecca E. Coath, Investigating the Use of Replica Morpho Butterfly Scales for Colour Displays, University of Southampton, School of Electronics and Computer Science, May 2007.

*Primary Examiner* — Ellen Kim
(74) *Attorney, Agent, or Firm* — Joseph G. Chu; Vic Y. Lin; Innovation Capital Law Group, LLP

(57) ABSTRACT

A silicon solar cell is provided, including a first silicon layer that absorbing sunlight, a first layer of a structure of photonic crystals formed on the first silicon layer, and a second silicon layer formed on the first layer of a structure of photonic crystals and absorbing sunlight, wherein the first silicon layer and the second silicon layer absorb sunlight at different wavelengths and the first layer of structure of photonic crystals selectively reflects light of a wavelength absorbed by the second silicon layer.

22 Claims, 26 Drawing Sheets

(56) References Cited

U.S. PATENT DOCUMENTS 7,151,629 B2 12/2006 Takagi et al.
7,274,849 B2 9/2007 Nobayashi et al.
2004/0187913 A1* 9/2004 Okada et al. ............ 136/255
2006/0002150 A1* 1/2006 Kim ......................... 362/627
2006/0050744 A1* 3/2006 Wong et al. ................ 372/3
2008/0302406 A1* 12/2008 Ohmi et al. .............. 136/247

* cited by examiner

US 9,052,425 B2

SILICON SOLAR CELL

CROSS REFERENCE TO PRIOR APPLICATIONS

This application claims the benefit of a prior-filed co-pending U.S. patent application Ser. No. 12/864,031 (filed on Jul. 22, 2010) under 35 U.S.C. §120, which is a National Stage Patent Application of International Patent Application No. PCT/KR2008/004054 (filed on Jul. 9, 2008) under 35 U.S.C. §371, which claims priority to Korean Patent Application No. 10-2008-0009148 (filed on Jan. 29, 2008), which are all hereby incorporated by reference in their entirety. This application also claims priority under 35 U.S.C. 119(a) to Korean Patent Application No. 10-2011-0114627, filed on Nov. 4, 2011, the disclosures of which is incorporated herein by reference in its entirety.

BACKGROUND

1. Field of the Invention

The present invention relates to a silicon solar cell, and more particularly to a silicon solar cell having a structure of photonic crystals to improve the efficiency of a solar cell and a silicon solar cell incorporating a spacer.

2. Description of the Related Art

Photonic crystals are periodic optical (nano) structures in which optical mediums or materials having different refractive indexes are alternately arranged with periodicity that is second to the wavelength of light, the photonic crystals having a lattice period that is similar to the wavelength of light.

Such photonic crystals have a structure in which a portion between periodically and regularly-arranged particles is filled with 1 the air. Photonic crystals may be changed by adjusting the wavelength of reflected light by filling other materials instead of the air.

Examples of such photonic crystal structures include Coleoptera and Morpho butterfly.

When Coleoptera is with flaps of the wings in nature, blue color flashes even in a dark forest. However, there is no color pigment in the wings of Coleoptera. Blue color is emitted by reflecting light having a predetermined wavelength and absorbing other lights due to a unique structure of the surface of the wings of Coleoptera. In this way, a phenomenon that color is generated even without color pigment is referred to as a structure color. FIG. 1 illustrates surface states of conventional photonic structures in which a Morpho butterfly found in South America, tail feathers of a peacock, a raw ore of opal, and the shell of an ormer that exist in the natural world and represent structure color due to photonic structures, are enlarged by using an electronic microscope.

Blue color is represented in the wings of the Morpho butterfly when the surface structure of the wings reflects blue light having a predetermined wavelength. The color of the Morpho butterfly is dark like the body or edges of the wings. Such structure is found even in the feathers of some kinds of birds such as buprestid, wood chat, and peacock. A multilayered photonic crystal structure in which small air bags are regularly stacked in the wings or feathers can be observed by using the electronic microscope. In addition, the surface of leaves of *Selaginella* which is a fern, has a multilayered photonic crystal structure.

A three dimensional structure of such photonic crystals is used to represent beautiful colors and simultaneously, has a very good characteristic for adjusting the flow of light. Thus, a method of producing the structure in industry is required.

FIG. 2 is a cross-sectional view of a conventional structure of photonic crystals that exist in the wings of a Morpho butterfly.

As illustrated in FIG. 2, the conventional structure of photonic crystals that exist in the wings of the Morpho butterfly, is a structure in which a plurality of bases 101 that are arranged vertically and a plurality of protrusions 102 that are arranged to be asymmetrical to side surfaces of the bases 101, are formed as one body.

The conventional structure of photonic crystals may represent similar color to that of Morpho butterfly, etc. However, shape structures of the conventional structure of photonic crystals and Morpho butterfly are asymmetrical. Thus, it is not easy to use an imprint processing method in the conventional structure of photonic crystals, and mass production is not possible.

Meanwhile, a silicon solar cell is an environmentally friendly generator that converts solar energy into electric energy, and many studies are continuously underway. In particular, what matters to a silicon solar cell is its efficiency. In this regard, a variety of attempts are being made to improve the efficiency of the silicon solar cell.

SUMMARY

The present invention provides a silicon solar cell having a structure of photonic crystals to improve the efficiency of a solar cell.

The present invention also provides a silicon solar cell incorporating a spacer.

These and other objects of the present invention will be described in or be apparent from the following description of the preferred embodiments.

According to an aspect of the present invention, there is provided a silicon solar cell including a first silicon layer that absorbing sunlight, a first layer of a structure of photonic crystals formed on the first silicon layer, and a second silicon layer formed on the first layer of a structure of photonic crystals and absorbing sunlight, wherein the first silicon layer and the second silicon layer absorb sunlight at different wavelengths and the first layer of structure of photonic crystals selectively reflects light in a wavelength absorbed by the second silicon layer.

According to another aspect of the present invention, there is provided a silicon solar cell including a plurality of silicon layers sequentially stacked, at least one reflective filter disposed between each of the plurality of silicon layers and selectively reflecting the light in a predetermined wavelength, and a plurality of spacers interposed between each of the plurality of silicon layers and components including the at least one reflective filter, the plurality of spacers providing for spaces between each of the respective components.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE EMBODIMENTS

Figure 1:
FIG. 1 illustrates structure of photonic structures.
Figure 2:
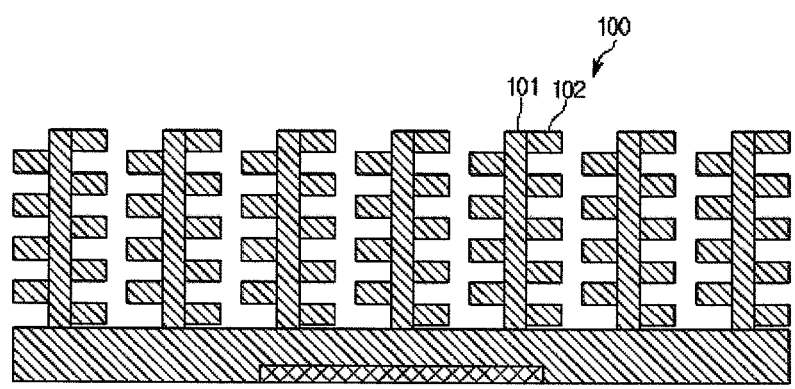
FIG. 2 is a cross-sectional view of a conventional structure of photonic crystals that exist in the wings of Morpho butterfly.

The present invention will now be described more fully with reference to the accompanying drawings, in which exemplary embodiments of the invention are shown. First, terms or words used in the present specification and the claims should not be construed as being limited to general or literal meaning, and the inventor should construe his/her own invention in meaning and concept that coincide with the technical spirit of the invention based on the principle for properly defining the concept of the terms so as to describe his/her own invention in the best manner.

Thus, configurations shown in embodiments and the drawings of the present invention rather is an example of the most exemplary embodiment and does not represent all of the technical spirit of the invention. Thus, it will be understood that various equivalents and modifications that replace the configurations are possible when filing the present application.

According to an aspect of the present invention, there is provided a method of manufacturing a structure of photonic crystals, the method including: forming a plurality of basic element layers by using a nanoimprinting method, the plurality of basic element layers comprising a plurality of basic unit bodies each having a symmetrical cross-section and thin film connecting portions connecting the basic unit bodies; sequentially stacking the basic element layers; removing the thin film connecting portions by using etching; and determining whether the structure of photonic crystals is completed, wherein, when it is determined that the structure of photonic crystals is not completed, the forming of the basic element layers, the stacking of the basic element layers, and the removing of the thin film connecting portions are repeatedly performed.

The forming of the basic element layers may include: aligning lower and upper molds that are formed by intaglio engraving bottom and top surfaces of photonic crystals; inserting a photonic crystal cloning material between the lower and upper molds; pressing the lower and upper molds to form the photonic crystal cloning material; curing the photonic crystal cloning material; and separating the lower and upper molds from each other.

Each of the basic unit bodies may have a "T"-shaped cross-section. The forming of the basic element layers may include: aligning a first forming roller that is formed by intaglio engraving a first side surface of the photonic crystals and a second forming roller that is formed by intaglio engraving a second side surface of the photonic crystals, in a line; passing a photonic crystal cloning material between the first forming roller and the second forming roller to simultaneously form both sides of the photonic crystal cloning material; and curing the photonic crystal cloning material.

An intaglio engraved shape of the first forming roller may be different from an intaglio engraved shape of the second forming roller so that both sides of the photonic crystal cloning material have different cross-sections. The stacking of the basic element layers may include aligning adjacent basic element layers to cross one another and stacking the basic element layers.

The stacking of the basic element layers may include stacking the basic element layers by changing top and bottom surfaces of a portion of the basic element layers.

The removing of the thin film connecting portions may include removing the thin film connecting portions by using plasma etching.

According to another aspect of the present invention, there is provided a structure of photonic crystals in which a plurality of basic element layers that are formed by using nanoimprinting and are sequentially stacked, the plurality of basic element layers comprising a plurality of basic unit bodies each having a "T"-shaped cross-section.

A height of each of the "T"-shaped basic unit bodies may be 0.5 to 1.5 µm, and a thickness of a horizontal portion of each of the basic unit bodies may be 0.1 to 0.5 µm, and a thickness of a vertical portion of each of the basic unit bodies may be 0.1 to 0.3 µm. The basic element layers may be arranged to cross adjacent basic element layers and are stacked.

According to another aspect of the present invention, there is provided a method of manufacturing a structure of photonic crystals, the method including: designing and determining the number of layers (n-layer) of the structure of photonic crystals; forming a plurality of basic element layers by using nanoimprinting, the plurality of basic element layers comprising a plurality of basic unit bodies each having a symmetrical cross-section and thin film connecting portions connecting the basic unit bodies; sequentially stacking the basic element layers; and removing the thin film connecting portions by using etching, wherein the forming of the basic element layers, the stacking of the basic element layers, and the removing of the thin film connecting portions are repeatedly performed (n-1) times.

According to another aspect of the present invention, there is provided an apparatus for manufacturing a structure of photonic crystals, the apparatus including: a lateral basic element layer forming roller portion comprising a first roller having a plurality of radial, symmetrical grooves formed in sides of the first roller, the first roller rotated by a driving portion, a second roller that is positioned to be engaged in a line with the first roller, and a photonic crystal cloning material first supplying portion supplying a photonic crystal cloning material between the first roller and the second roller; and a longitudinal basic element layer forming roller portion comprising a third roller that is formed at one side of the lateral basic element layer forming roller portion and is positioned above the photonic crystal cloning material passing the lateral basic element layers and has a plurality of lengthwise, symmetrical grooves formed insides of the third roller, a fourth roller that is positioned to be engaged in a line with the third roller, and a photonic crystal cloning material second supplying portion supplying a photonic crystal cloning material between the third roller and the fourth roller, wherein the photonic crystal cloning material passing the longitudinal basic element layer forming roller portion is stacked on the photonic crystal cloning material passing the lateral basic element layer forming roller portion.

Each of the grooves of the first roller may have a "T"-shaped cross-section. The lateral basic element layer forming roller portion may further include: a first carrier film supplying portion which is formed above the lateral basic element layer forming roller portion and supplies a carrier film between the first roller and the second roller; and a first carrier film winding portion which winds the carrier film passing between the first roller and the second roller and stores the carrier film, and the longitudinal basic element layer forming roller portion may further include: a second carrier film supplying portion which is formed above the longitudinal basic element layer forming roller portion and supplies a carrier film between the third roller and the fourth roller; and a second carrier film winding portion which winds the carrier film passing between the third roller and the fourth roller and stores the carrier film.

According to another embodiment of the present invention, there is provided a structure of photonic crystals including a plurality of basic element layers comprising a plurality of basic unit bodies each having a "T"-shaped cross-section repeatedly arranged in a first direction and spaced a predetermined distance apart from each other. Each of the basic unit bodies has a horizontal portion extending in the first direction, and a vertical portion extending from the center of the horizontal portion in a second direction perpendicular to the first direction, and a width of the vertical portion in the first direction is smaller than a width of the horizontal portion in the first direction, and the width of the vertical portion in the first direction is constant.

According to an aspect of the present invention, there is provided a method of manufacturing a structure of photonic crystals, the method including: forming a plurality of basic element layers by using nanoimprinting, the plurality of basic element layers comprising a plurality of basic unit bodies each having a "T"-shaped cross section and thin film connecting portions connecting the basic unit bodies; aligning the basic element layers; and removing the thin film connecting portions of the basic element layers, wherein each of the basic unit bodies has a horizontal portion extending in the first direction, and a vertical portion extending from the center of the horizontal portion in a second direction perpendicular to the first direction, and a width of the vertical portion in the first direction is smaller than a width of the horizontal portion in the first direction, and the width of the vertical portion in the first direction is constant.

Meanwhile, according to an aspect of the present invention, there is provided an apparatus for manufacturing a structure of photonic crystals, the apparatus including a first forming roller that has a plurality of grooves formed by intaglio engraving a side surface of the photonic crystals and mounted to be rotated by a driver to form the structure of photonic crystals.

In addition, the structure of photonic crystals according to the present invention include basic element layers each comprising a plurality of basic unit bodies having "T"-shaped cross sections repeatedly arranged in a first direction and spaced a predetermined distance apart from each other; each of the basic unit bodies has a horizontal portion extending in the first direction, and a vertical portion extending from the center of the horizontal portion in a second direction perpendicular to the first direction; and a width of the vertical portion in the first direction is smaller than a width of the horizontal portion in the first direction, and the width of the vertical portion in the first direction is constant.

In addition, the method of manufacturing a structure of photonic crystals according to the present invention includes forming a plurality of basic element layers by using nanoimprinting, the plurality of basic element layers comprising a plurality of basic unit bodies each having a "T"-shaped cross section and thin film connecting portions connecting the basic unit bodies arranged in a first direction and spaced a predetermined distance apart from each other; aligning the basic element layers by using nanoimprinting; aligning the basic element layers; and removing the thin film connecting portions of the basic element layers, wherein each of the basic unit bodies has a horizontal portion extending in the first direction, and a vertical portion extending from the center of the horizontal portion in a second direction perpendicular to the first direction; and a width of the vertical portion in the first direction is smaller than a width of the horizontal portion in the first direction, and the width of the vertical portion in the first direction is constant.

Figure 3:
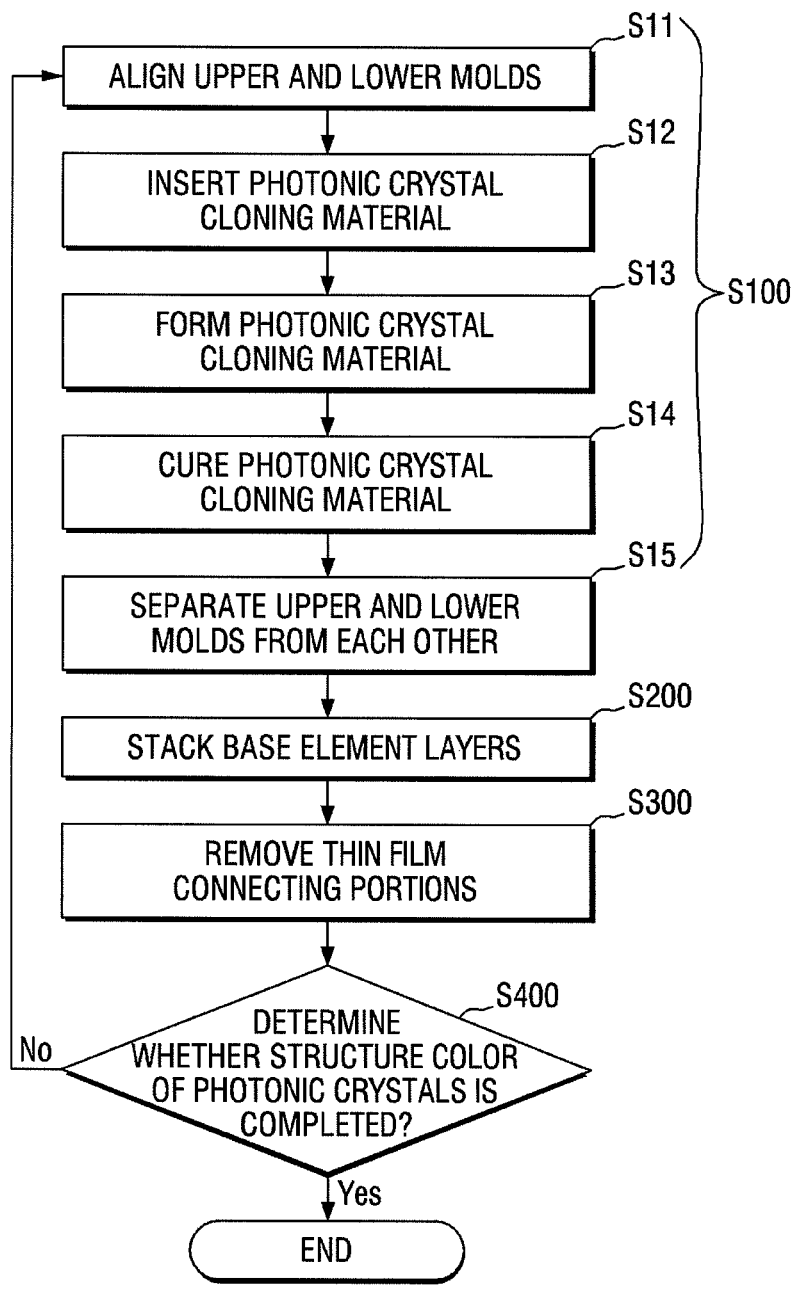
FIG. 3 is a flowchart illustrating a method of manufacturing a structure of photonic crystals according to an embodiment of the present invention.
Figure 4:
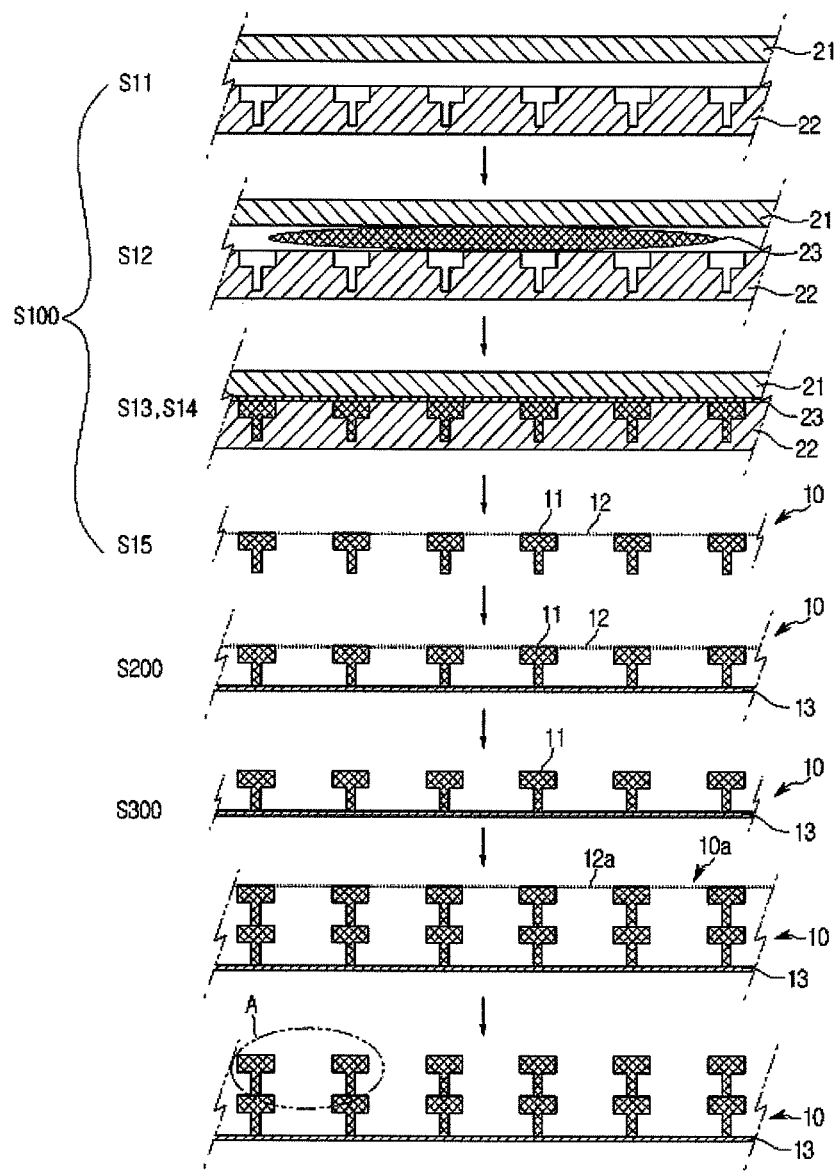
FIG. 4 is a cross-sectional view illustrating each of operations of the method of manufacturing the structure of photonic crystals illustrated in FIG. 3.
Figure 5:
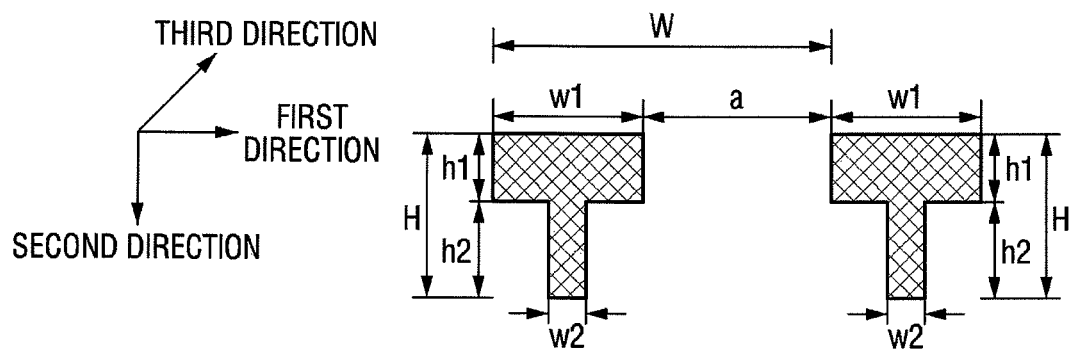
FIG. 5 is an enlarged view of a portion "A" of FIG. 4.
Figure 6:
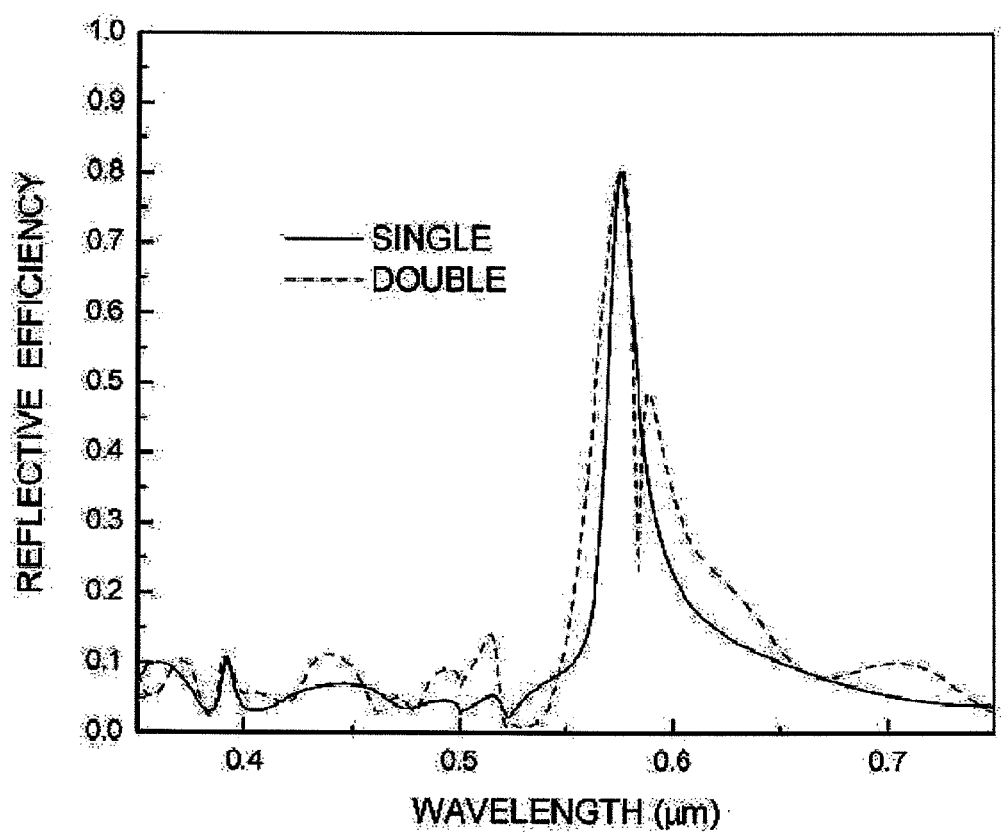
FIG. 6 is a graph showing wavelength (μm) versus reflective efficiency and showing optical characteristic spectrum data of the structure of photonic crystals that is formed by the method of manufacturing the structure of photonic crystals illustrated in FIG. 3.

FIG. 3 is a flowchart illustrating a method of manufacturing a structure of photonic crystals according to an embodiment of the present invention, FIG. 4 is a cross-sectional view illustrating each of operations of the method of manufacturing the structure of photonic crystals illustrated in FIG. 3, FIG. 5 is an enlarged view of a portion "A" of FIG. 4, and FIG. 6 is a graph showing wavelength (μm) versus reflective efficiency and showing optical characteristic spectrum data of the structure of photonic crystals that is formed by the method of manufacturing the structure of photonic crystals illustrated in FIG. 3.

As illustrated in FIGS. 3 and 4, the method of manufacturing the structure of photonic crystals according to the current embodiment of the present invention comprises forming basic element layers 10 (S100), stacking the basic element layers 10 (S200), removing thin film connecting portions (S300), and determining whether the structure of photonic crystals is completed (S400).

The forming of the basic element layers 10 (S100) comprises forming the basic element layers 10 each comprising a plurality of basic unit bodies 11 and a plurality of thin film connecting portions 12.

Each of the basic unit bodies 11 has a symmetrical cross-section. In the current embodiment, each of the basic unit bodies 11 is "T"-shaped.

Referring to FIGS. 4 and 5, each of the plurality of solid basic unit bodies 11 comprises a horizontal portion that extends in the first direction (in a 'W' direction in FIG. 5), and a vertical portion 16 that extends from the center of the horizontal portion to a lower part thereof in a second direction (in a 'H' direction in FIG. 5) perpendicular to the first direction. In addition, a width w2 of the vertical portion in the first direction is smaller than a width w1 of the horizontal portion in the first direction, and the width w2 of the vertical portion in the first direction is constant. That is to say, the vertical portion has a flat surface without uneven surface portions.

A height H of each of the "T"-shaped basic unit bodies 11 is 0.5 to 1.5 μm, a width W thereof is 0.5 to 1.5 μm, and a height h1 of an upper portion of each of the "T"-shaped basic unit bodies 11 is 0.1 to 0.5 μm, and a height h2 of a lower portion of each of the "T"-shaped basic unit bodies 11 is 0.5 to 1.0 μm, and a width w1 of the upper portion is 0.5 to 1.0 μm, and a width w2 of the lower portion is 0.1 to 0.3 μm, and a distance 'a' between the basic unit bodies 11 is (0.5 to 1.0).times.w1, and W/H=0.75 to 1.25, h1/h2=0.5 to 0.8.

As described above, since the structure of photonic crystals according to an embodiment of the present invention is minute-sized, it is quite difficult to manufacture in an accurate shape. When the structure of photonic crystals, which is micro-sized, is manufactured by using etching (dry etching or wet etching) using a gas or an etching solution, uneven surface portions may be formed, an etched surface may be tapered, or unintended tilts may be produced. If the structure of photonic crystals is not manufactured in an accurate shape, the quality of the structure of photonic crystals may be deteriorated. In particular, the structure of photonic crystals causes reflection at a predetermined wavelength by adjusting the structure and size. Thus, if the structure of photonic crystals is not manufactured to have accurate size and structure, it is highly likely to be treated as a bad structure.

The structure of photonic crystals according to an embodiment of the present invention is manufactured by using a nanoimprinting method. The minute sized vertical portion may be formed to have a constant level without forming uneven surface portions. Therefore, the structure of photonic crystals according to an embodiment of the present invention may have a superior quality, compared to the structure of photonic crystals manufactured by using etching. In addition, since a process time can be reduced and mass production is possible, thereby greatly increasing the productivity and mass production efficiency.

Each of the thin film connecting portions 12 connecting the plurality of basic unit bodies 11 is formed on both ends of each of the basic unit bodies 11, and the basic unit bodies 11 and the thin film connecting portions 12 are formed by using a nanoimprinting method.

The nanoimprinting method comprises aligning upper and lower molds 21 and 22 (S11), inserting a photonic crystal cloning material 23 between the upper and lower molds 21 and 22 (S12), pressing the upper and lower molds 21 and 22 to form the photonic crystal cloning material 23 (S13), curing the photonic crystal cloning material 23 (S14), and separating the upper and lower molds 21 and 22 from each other (S15).

The upper and lower molds 21 and 22 are formed by intaglio engraving bottom and top surfaces of the photonic crystals in the same manner as bottom and top surfaces of the structure of photonic crystals.

Each of the upper and lower molds 21 and 22 is formed of silicon (Si), glass, polymer, quartz or metal and is processed by using electron beam (E-beam) lithography, laser machining, photolithography, laser interference lithography or X-ray interference lithography.

The photonic crystal cloning material 23 that is inserted between the upper and lower molds 21 and 22 is formed of a photocurable or thermosetting resin.

After that, the upper and lower molds 21 and 22 are formed by pressing the photonic crystal cloning material 23 at 20-40 bar, and after formation is completed, the photonic crystal cloning material 23 is cured, and the basic element layers 10 are formed (S14).

The photonic crystal cloning material 23 is cured by heating or irradiating ultraviolet (UV) rays. In the current embodiment, UV rays are irradiated for 1-15 minutes or heating is performed at 40-150.degree.C. for 1-10 minutes, thereby promoting curing of the photonic crystal cloning material 23.

When curing of the photonic crystal cloning material 23 is completed, the upper and lower molds 21 and 22 are separated from each other, thereby forming the basic element layers 10 (S15).

The basic element layers 10 that are initially manufactured are stacked on a substrate 13 formed of metal or plastics.

When the stacking process is performed, each of the basic unit bodies 11 is connected by each of the thin film connecting portions 12 so that the basic unit bodies 11 are prevented from being separated from one another and the stacking process can be easily performed.

When the stacking process is performed, an adhesive layer is formed between the basic element layer 10 and the substrate 13 or a contact surface therebetween is fused so that the basic element layer 10 can be attached to the substrate 13.

Next, the thin film connecting portions 12 of the plurality of stacked basic element layers 10 are removed. The thin film connecting portions 12 are removed by using plasma etching.

In the current embodiment, the thin film connecting portions 12 are removed by using plasma etching. However, the thin film connecting portions 12 may be removed by using general chemical etching, reactive ion etching (RIE), etc.

When the removing of the thin film connecting portions 12 (S300) is completed, the forming of the basic element layers 10 (S100) is repeatedly performed to form new basic element layers 10*a*, and the newly-formed basic element layers 10*a* are arranged and stacked on the basic element layers 10 that have been already stacked on the substrate 13.

When the new basic element layers 10*a* are stacked on the top surface of the basic element layers 10, the new basic element layers 10*a* are aligned by checking a color and a pattern in which light having a predetermined wavelength is irradiated on the stacked basic element layers 10 and 10*a* at a predetermined angle and the light is reflected, or the new basic element layers 10*a* are arranged and stacked on the basic element layers 10 by checking a color and a pattern in which white light is irradiated on the stacked basic element layers 10 and 10*a* at a predetermined angle and the white light is reflected. When the basic element layers 10*a* are stacked, an adhesive layer is formed between the stacked basic element layers 10 and the newly-stacked basic element layers 10*a*, or a contact surface therebetween is fused so that the adjacent basic element layers 10 and 10*a* can be combined with each other.

Next, a plurality of thin film connecting portions 12*a* of the basic element layers 10*a* that are positioned in the uppermost position are removed by using plasma etching.

When the thin film connecting portions 12*a* are removed, it is determined whether the structure of photonic crystals is completed (S400), and the forming of the basic element layers 10 (S100), the stacking of the basic element layers 10 (S200), and the removing of the thin film connecting portions 12 (S300) are repeatedly performed until the structure of photonic crystals is completed.

FIG. 6 is a graph showing wavelength (μm) versus reflective efficiency and showing optical characteristic spectrum data of the structure of photonic crystals that is formed by the method of manufacturing the structure of photonic crystals illustrated in FIG. 3. FIG. 6 illustrates the result of reflection in case when each of basic unit bodies has the size of w1=1.0 μm, H=1.0 μm, and w2=0.2 μm and a distance 'a' between the basic unit bodies is 0.4 μm.

"Single" of the graph of FIG. 6 indicates the case where only a layer is stacked, and "Double" of the graph of FIG. 6 indicates the case where two layers are stacked. In both cases, a reflective characteristic is shown at a predetermined wavelength (green yellow color having a wavelength of approximately 0.58 μm).

Figure 7:
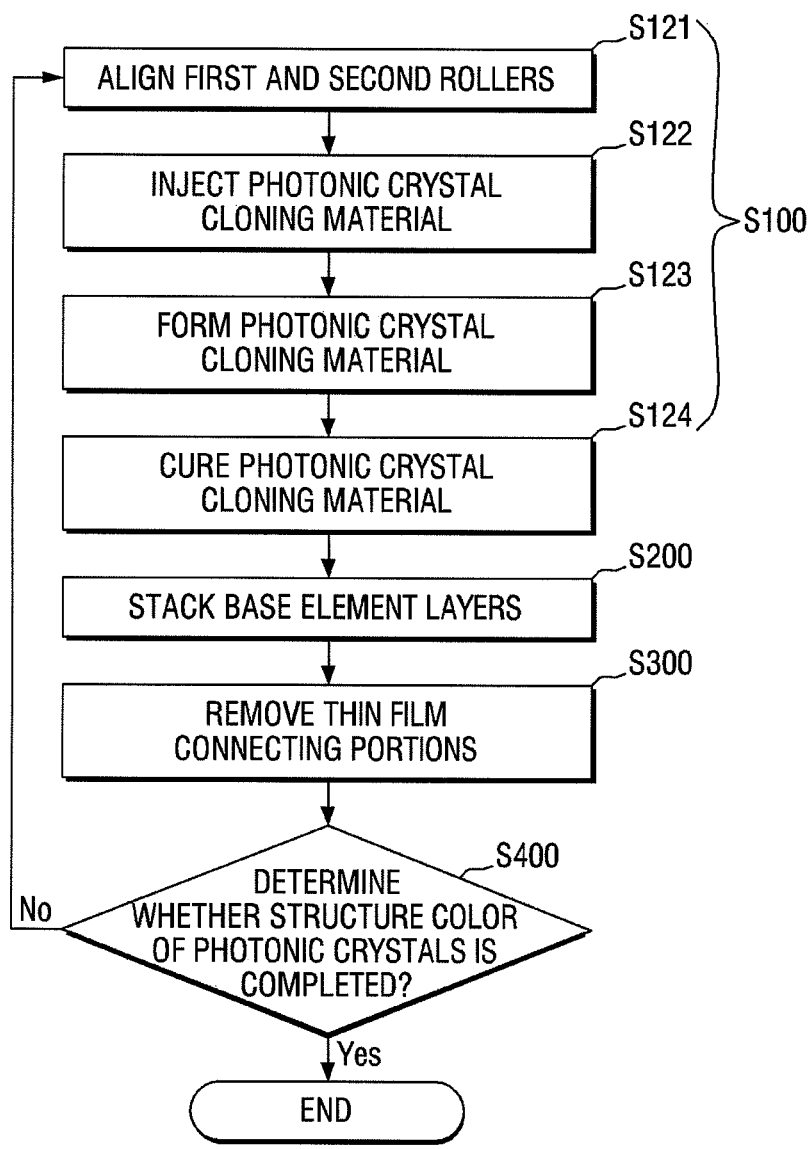
FIG. 7 is a flowchart illustrating a method of manufacturing a structure of photonic crystals according to another embodiment of the present invention.
Figure 8:
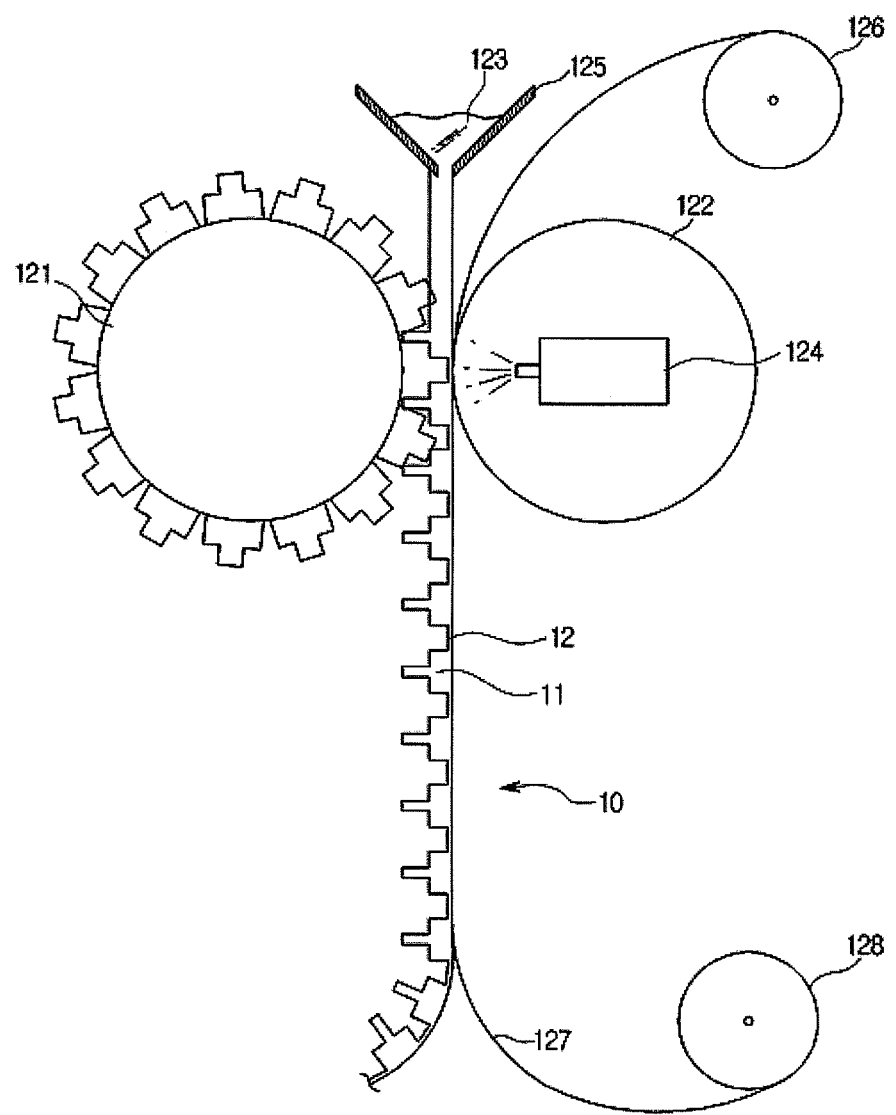
FIG. 8 is a cross-sectional view of an apparatus for manufacturing the basic element layers illustrated in FIG. 7.

FIG. 7 is a flowchart illustrating a method of manufacturing a structure of photonic crystals according to another embodiment of the present invention, and FIG. 8 is a cross-sectional view of an apparatus for forming the basic element layers illustrated in FIG. 7.

The current embodiment of FIG. 7 is characterized by a different operation of forming the basic element layers from that of FIG. 3. Thus, the same operations as those of FIG. 3 will be omitted and the operation of forming the basic element layers will now be described in details.

As illustrated in FIGS. 7 and 8, the operation of forming the basic element layers (S100) of the method of manufacturing the structure of photonic crystals of FIG. 7 comprises aligning first and second forming rollers 121 and 122 in a line (S121), injecting a photonic crystal cloning material 123 between the first and second forming rollers 121 and 122, forming the photonic crystal cloning material 123 (S123), curing the formed photonic crystal cloning material 123 (S124).

An outer circumferential edge of the first forming roller 121 is intaglio engraved in the same manner as a first side surface of a final structure of photonic crystals, and an outer circumferential edge of the second forming roller 122 is formed in the same manner as a second side surface of the final structure of photonic crystals.

In the structure of photonic crystals that is generated in FIG. 7, "T"-shaped basic unit bodies are consecutively formed. The outer circumferential edge of the first forming roller 121 is formed in a rectangular gear shape at regular intervals, and the outer circumferential edge of the second forming roller 122 is flat.

After the first and second forming rollers 121 and 122 are aligned, the photonic crystal cloning material 123 formed of UV polymer is injected between the first and second forming rollers 121 and 122 by using a hopper 125. The photonic crystal cloning material 123 passes between the first and second forming rollers 121 and 122 and is pressed and both side surfaces of the photonic crystal cloning material 123 are formed simultaneously so that the photonic crystal cloning material 123 is formed in the shape in which "T"-shapes are consecutively formed.

The photonic crystal cloning material 123 that is formed by the first and second forming rollers 121 and 122 is cured by an exposure device 124 installed in the second forming roller 122. The photonic crystal cloning material 123 is used to form the basic element layers 10. In the current embodiment, the exposure device 124 is an UV lamp that cures the photonic crystal cloning material 123, and the second forming roller 122 is formed of a transparent material so that UV light emitted by the UV lamp can be effectively irradiated on the photonic crystal cloning material 123.

Meanwhile, a carrier film supplying unit 126 is formed above the first and second forming rollers 121 and 122. The carrier film supplying unit 126 supplies a carrier film 127 to one side of the photonic crystal cloning material 123 that is supplied between the first and second forming rollers 121 and 122.

The carrier film 127 is conveyed while being combined with the side of the photonic crystal cloning material 123 so that the photonic crystal cloning material 123 can be more stably conveyed.

A carrier film winding roller 128 that separates the carrier film 127 passing between the first and second forming rollers 121 and 122 from the photonic crystal cloning material 123 and winds the carrier film 127, is installed below the first and second forming rollers 121 and 122.

The current embodiment of FIG. 7 has an advantage that basic element layers are consecutively manufactured by using an imprinting method using a roller and a large amount of photonic crystal cloning material can be formed within a short time.

Figure 9:
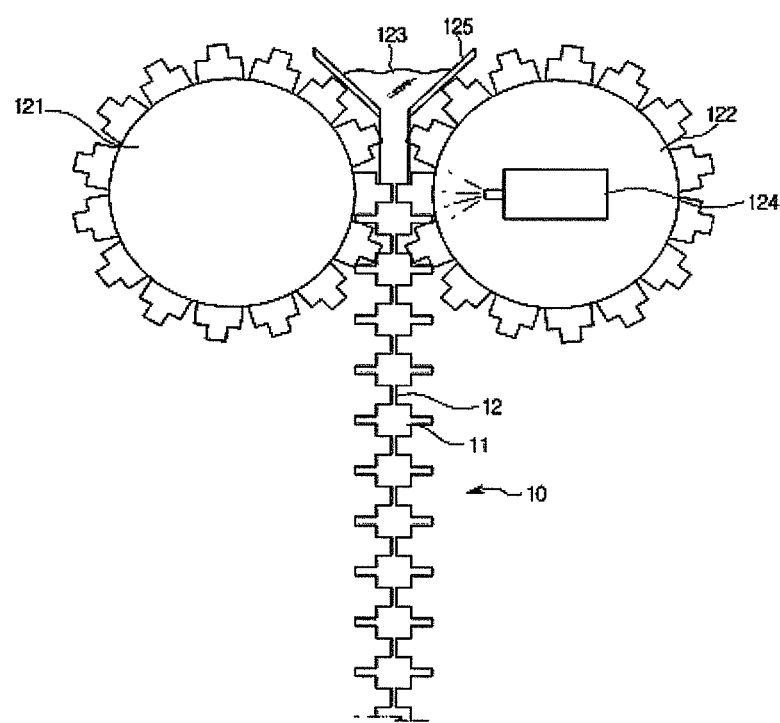
FIG. 9 is a cross-sectional view of an apparatus for manufacturing basic element layers of a structure of photonic crystals according to another embodiment of the present invention.
Figure 10:
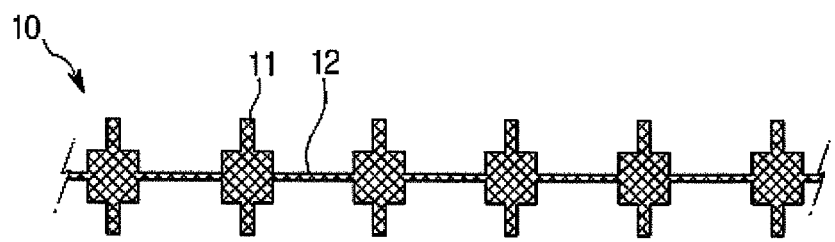
FIG. 10 is a cross-sectional view of the basic element layers of FIG. 9.

FIG. 9 is a cross-sectional view of an apparatus for forming basic element layers of a structure of photonic crystals according to another embodiment of the present invention, and FIG. 10 is a cross-sectional view of the basic element layers of FIG. 9.

As illustrated in FIGS. 9 and 10, in the current embodiment, the outer circumferential edge of the second forming roller 122 is intaglio engraved, thereby generating the basic element layers 10 in which both sides of the photonic crystal cloning material 123 are simultaneously processed and which have various shapes at their both sides.

For example, referring to FIG. 10, the basic unit bodies constituting two adjacent basic element layers may be configured such that one side planes of the horizontal portions thereof are in contact with each other. Here, in the adjacent basic unit bodies, the basic element layers may be stacked such that the other side planes facing the one side planes connected to the vertical portion are in contact with each other.

According to the current embodiment of FIG. 9, both sides of the photonic crystal cloning material 123 are simultaneously processed by using the first and second forming rollers 121 and 122 so that the basic element layers 10 can have various shapes and a production time is reduced.

Figure 11:
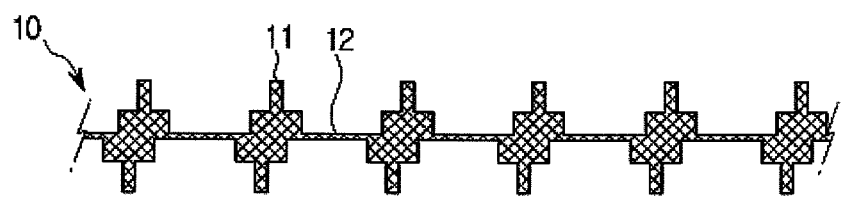
FIG. 11 is a cross-sectional view of basic element layers according to another embodiment of the present invention.

FIG. 11 is a cross-sectional view of basic element layers according to another embodiment of the present invention.

In the current embodiment of FIG. 11, pitches of a rectangular gear shape that is engraved on the first forming roller 121 and the second forming roller 122, are differently formed and both sides of the photonic crystal cloning material 123 are differently processed so that basic element layers having different both-side shapes can be formed.

The basic element layers of FIG. 11 have different pitches of their both sides so that the basic element layers can have unique optical characteristics and a difference between pitches of both sides of the basic element layers is adjusted and optical characteristics can be changed.

Figure 12:
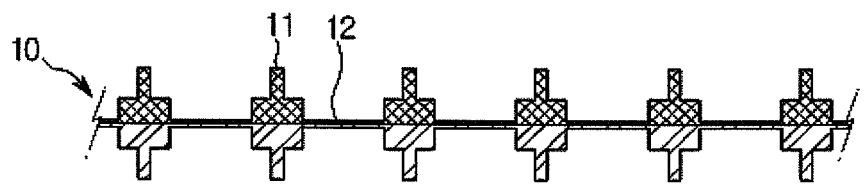
FIG. 12 is a cross-sectional view of basic element layers according to another embodiment of the present invention.

FIG. 12 is a cross-sectional view of basic element layers according to another embodiment of the present invention.

In the current embodiment of FIG. 12, the basic element layers 10 are formed by injecting two kinds of photonic crystal cloning materials 123 between the first forming roller 121 and the second forming roller 122.

The basic element layers 10 are formed by inserting the photonic crystal cloning material 123 having two, different materials between the first forming roller 121 and the second forming roller 122.

The basic element layers 10 of FIG. 12 comprise layers formed of two, different materials, thereby implementing various optical characteristics.

Figure 13:
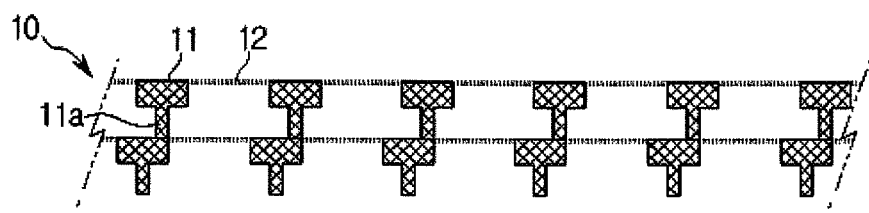
FIG. 13 is a cross-sectional view of a structure of photonic crystals according to another embodiment of the present invention.

FIG. 13 is a cross-sectional view of a structure of photonic crystals according to another embodiment of the present invention.

As illustrated in FIG. 13, the structure of photonic crystals according to the current embodiment of the present invention is a structure of photonic crystals in which vertical portions 11a of "T"-shaped basic unit bodies are not arranged on the same line as adjacent basic element layers but are arranged laterally to cross one another and the basic element layers 10 are stacked.

In the current embodiment of FIG. 13, the vertical portions 11a of the basic unit bodies of the adjacent basic element layers 10 are arranged to cross one another so that the structure of photonic crystals has an optical representation characteristic in a predetermined direction.

Figure 14:
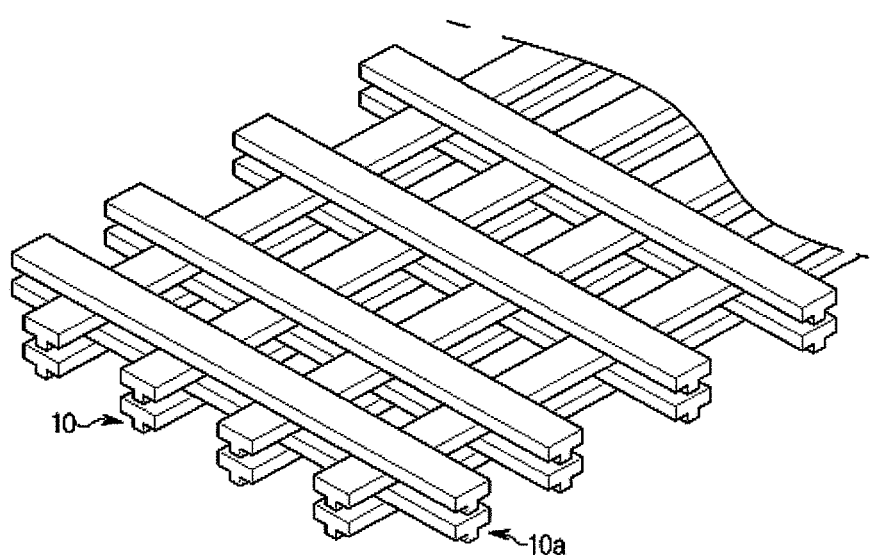
FIG. 14 is a perspective view of a structure of photonic crystals according to another embodiment of the present invention.

FIG. 14 is a perspective view of a structure of photonic crystals according to another embodiment of the present invention.

As illustrated in FIG. 14, in the structure of photonic crystals according to the current embodiment of the present invention, basic element layers that are formed by the method of manufacturing the structure of photonic crystals of FIG. 3 are stacked perpendicular thereto.

In other words, in the structure of photonic crystals of FIG. 14, next basic element layers 10a cross the adjacent "T"-shaped basic element layers 10 perpendicular thereto. In the current embodiment, four layers are stacked.

In the method of manufacturing the structure of photonic crystals of FIG. 14 by which the next basic element layers 10a cross the adjacent basic element layers 10 perpendicular thereto, the photonic crystal cloning material is aligned by checking a color and a pattern in which light having a predetermined wavelength is irradiated on the photonic crystal cloning material and the light is reflected during a stacking operation, or a process of correcting arrangement of the photonic crystal cloning material can be omitted after checking a color and a pattern in which white light is irradiated on the photonic crystal cloning material at a predetermined angle and the white light is reflected, so that mass productivity is remarkably improved, compared to the method of manufacturing the structure of photonic crystals according to another embodiment of the present invention by which the next basic element layers 10a are stacked to be parallel to the adjacent basic element layers 10.

In addition, according to the current embodiment of FIG. 14, a three dimensional structure of photonic crystals can be formed without performing an additional process.

Figure 15:
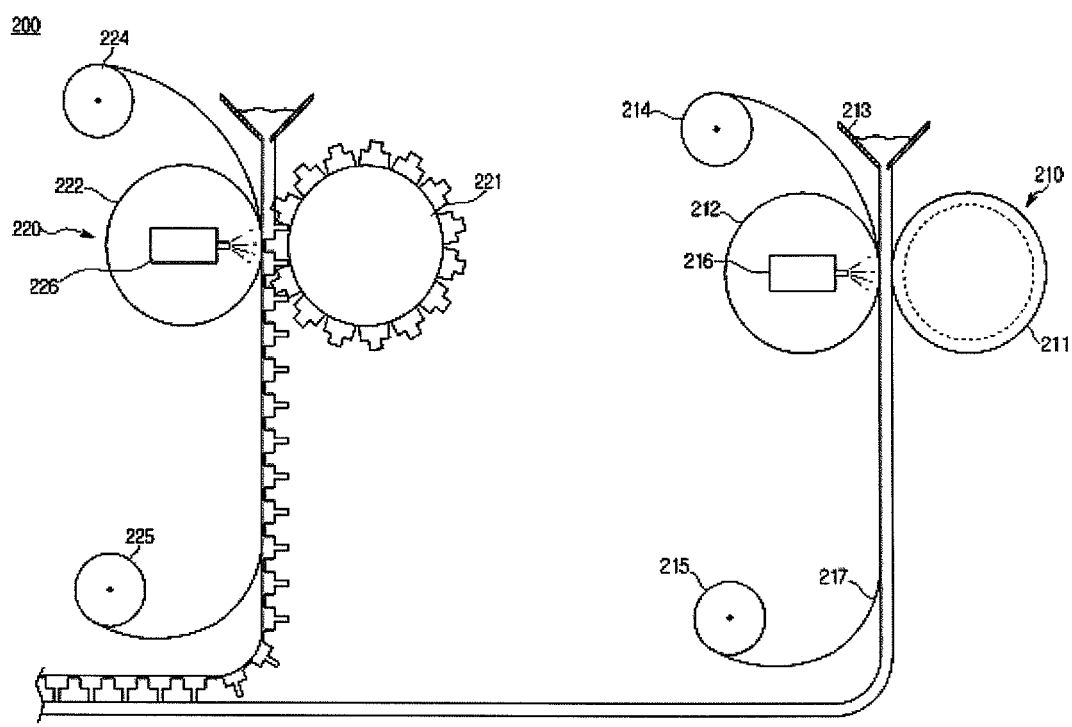
FIG. 15 illustrates an apparatus for manufacturing a structure of photonic crystals illustrated in FIG. 14.
Figure 16:
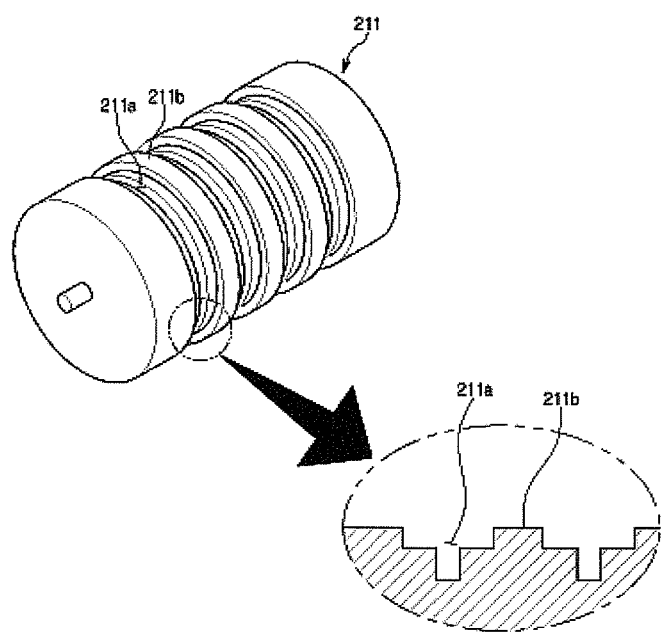
FIG. 16 is a perspective view of a first roller of FIG. 15.
Figure 17:
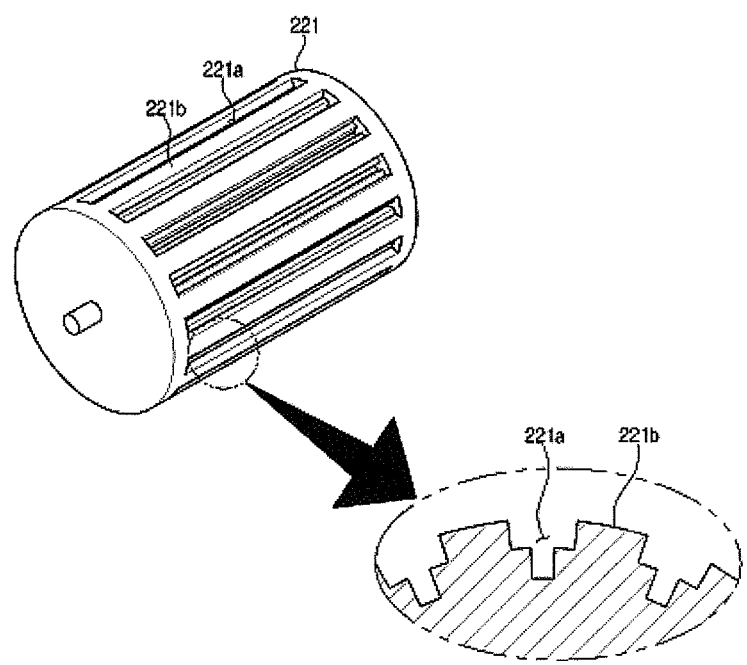
FIG. 17 is a perspective view of a third roller of FIG. 15.

FIG. 15 illustrates an apparatus 200 for manufacturing a structure of photonic crystals according to another embodiment of the present invention, FIG. 16 is a perspective view of a first roller of FIG. 15, and FIG. 17 is a perspective view of a third roller of FIG. 15.

As illustrated in FIG. 15, the apparatus 200 for manufacturing the structure of photonic crystals according to the current embodiment of the present invention comprises a lateral basic element layer forming roller portion 210 and a longitudinal base element layer forming roller portion 220.

The lateral basic element layer forming roller portion 210 comprises first and second rollers 211 and 212, a photonic crystal cloning material first supplying portion 213, a first carrier film supplying unit 214, and a first carrier film winding portion 215.

The first roller 211 is rotated by a driving portion, and a plurality of basic unit body forming grooves 211a each having a radial, symmetrical cross-section are formed in sides of the first roller 211. The cross-section of each of the basic unit body forming grooves 211a is "T"-shaped, and a plurality of thin film connecting portion forming portions 211b are formed between the basic unit body forming grooves 211a.

The second roller 212 is formed at one side of the first roller 211. The second roller 212 has a flat surface shape and is parallel to one side of the first roller 211, and a photocurable device 216 which cures a photonic crystal cloning material passing between the first and second rollers 211 and 212, is installed in the second roller 212.

The photonic crystal cloning material first supplying portion 213 which supplies the photonic crystal cloning material between the first roller 211 and the second roller 212, is formed above the first and second rollers 211 and 212.

Meanwhile, the first carrier film supplying portion 214 which supplies a carrier film 217 between the first and second rollers 211 and 212, is formed above the lateral basic element layer forming roller portion 210.

The carrier film 217 that is supplied by the first carrier film supplying portion 214, is formed at one side of the photonic crystal cloning material passing the first and second rollers 211 and 212 so that the photonic crystal cloning material can be stably conveyed.

Meanwhile, the longitudinal basic element layer forming roller portion 220 is formed at one side of the lateral base element layer forming roller portion 210.

The longitudinal basic element layer forming roller portion 210 comprises a third roller 221, a fourth roller 222, a photonic crystal cloning material second supplying portion 223, a second carrier film supplying portion 224, and a second carrier film winding portion 225.

The third roller 221 is positioned above the photonic crystal cloning material (basic element layer) that is formed by the lateral basic element layer forming roller portion 210, and a plurality of basic unit body forming grooves 221a each having a lengthwise, symmetrical shape are formed in sides of the third roller 221, and a plurality of thin film connecting portion forming portions 221b are formed between the basic unit body forming grooves 221a.

Each of the basic unit body forming grooves 221a has a "T"-shaped cross-section.

The fourth roller 222 is positioned at one side of the third roller 221 in a line with the third roller 221, and a photocurable device 226 is installed in the fourth roller 222. The photocurable device 226 cures the photonic crystal cloning material passing between the third and fourth rollers 221 and 222.

The photonic crystal cloning material second supplying portion 223 which supplies the photonic crystal cloning material between the third roller 221 and the fourth roller 222, is installed above the third and fourth rollers 221 and 222.

In addition, the second carrier film supplying portion 224 which supplies the carrier film 217 between the third roller 221 and the fourth roller 222, is formed above the third and fourth rollers 221 and 222, and the second carrier film winding portion 225 which winds and stores the carrier film 217 passing between the third and fourth rollers 221 and 222, is formed below the third and fourth rollers 221 and 222.

The carrier film 217 that is supplied by the second carrier film supplying portion 224 allows the photonic crystal cloning material to pass between the third and fourth rollers 221 and 222 and to be deposited on the photonic crystal cloning material passing between the first and second rollers 211 and 212.

When the photonic crystal cloning material passing between the third and fourth rollers 221 and 222 is consecutively deposited on the photonic crystal cloning material passing between the first and second rollers 211 and 212, a two-layered photonic crystal cloning material is formed. When one of the lateral basic element layer forming roller portion 210 and one of the longitudinal basic element layer forming roller 220 are sequentially added to the apparatus 200 for manufacturing the structure of photonic crystals of FIG. 15, a four-layered photonic crystal cloning material is formed so that the same photonic crystal cloning structure as FIG. 15 can be consecutively manufactured.

Figure 18:
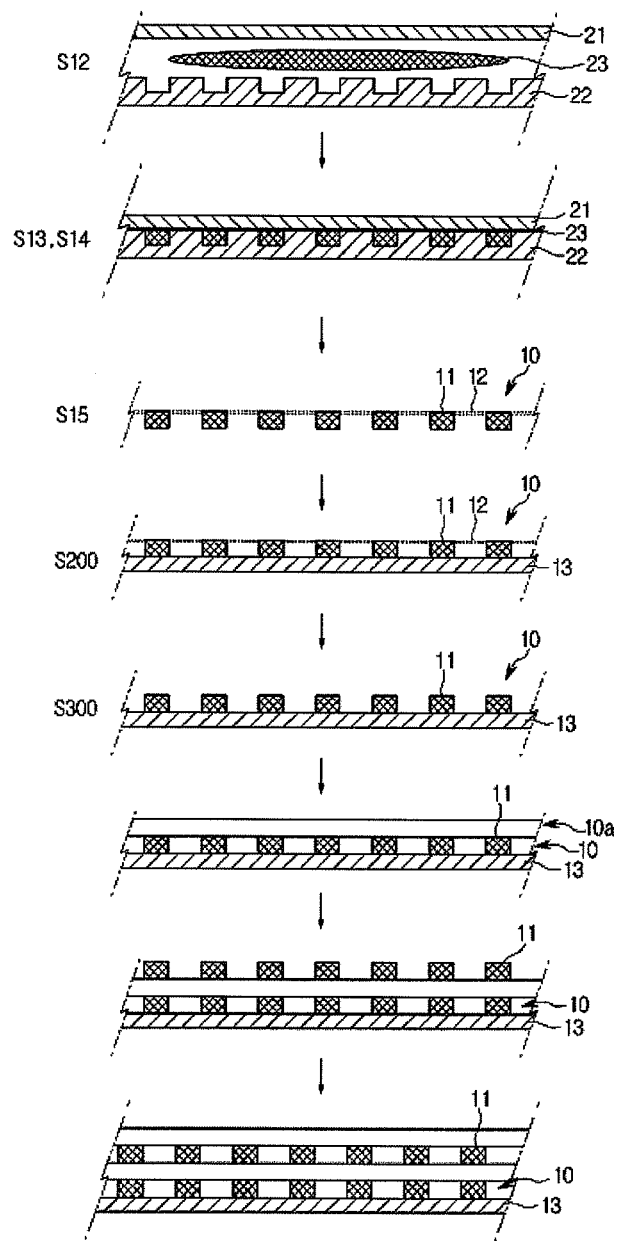
FIG. 18 is a cross-sectional view of each operations of a method of manufacturing a structure of photonic crystals according to another embodiment of the present invention.
Figure 19:
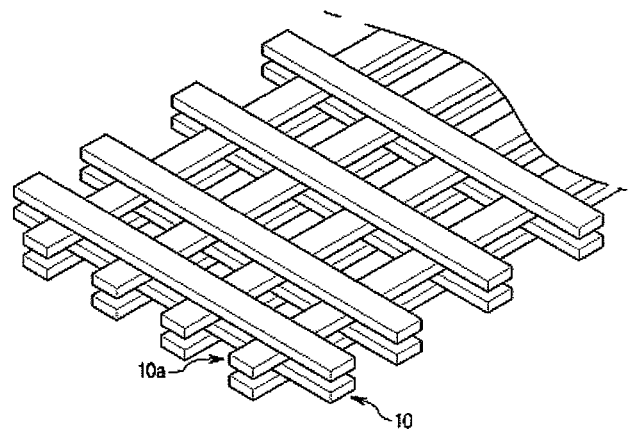
FIG. 19 is a perspective view of the structure of photonic crystals which is manufactured by the method of FIG. 18 and in which basic element layers are stacked perpendicular thereto.

FIG. 18 is a cross-sectional view of each of operations of a method of manufacturing a structure of photonic crystals according to another embodiment of the present invention, and FIG. 19 is a perspective view of the structure of photonic crystals which is manufactured by the method of FIG. 18 and in which basic element layers are stacked perpendicular thereto.

As illustrated in FIG. 18, each of basic element layers 10 of the structure of photonic crystals according to the current embodiment of the present invention has a rectangular cross-section.

The method of manufacturing the structure of photonic crystals of FIG. 18 comprises forming the basic element layers 10 (S100), stacking the basic element layers 10 (S200), removing thin film connecting portions (S300), and determining whether the structure of photonic crystals is completed (S400).

The forming of the basic element layers 10 comprises forming the basic element layers 10 each comprising a plurality of basic unit bodies 11 and a plurality of thin film connecting portions 12.

The forming of the basic element layers 10 (S100) comprises: aligning lower and upper molds that are formed by intaglio engraving bottom and top surfaces of photonic crystals; inserting a photonic crystal cloning material between the lower and upper molds (S12); pressing the lower and upper molds to form the photonic crystal cloning material (S13); curing the photonic crystal cloning material (S14); and separating the lower mold and the upper mold from each other (S15).

The detailed description of each of the operations is the same as that of FIG. 3 and thus, a detailed description thereof will be omitted.

The prism-shaped basic element layers 10 each having a rectangular cross-section, as illustrated in FIG. 18, next basic element layers 10a cross the adjacent "T"-shaped basic element layers 10 perpendicular thereto. In the current embodiment, four layers are stacked.

In the method of manufacturing the structure of photonic crystals of FIG. 18 by which the next basic element layers 10a cross the adjacent basic element layers 10 perpendicular thereto, the photonic crystal cloning material is aligned by checking a color and a pattern in which light having a predetermined wavelength is irradiated on the photonic crystal cloning material and the light is reflected during a stacking operation, or a process of correcting arrangement of the photonic crystal cloning material can be omitted after checking a color and a pattern in which white light is irradiated on the photonic crystal cloning material at a predetermined angle and the white light is reflected, so that mass productivity is remarkably improved, compared to the method of manufacturing the structure of photonic crystals according to another embodiment of the present invention by which the next basic element layers 10a are stacked to be parallel to the adjacent basic element layers 10.

The structure of photonic crystals of FIG. 18 may be consecutively manufactured by replacing the first and third rollers of the apparatus for manufacturing the structure of photonic crystals of FIG. 15 with first and third rollers of FIGS. 20 and 21 that will be described later.

Figure 20:
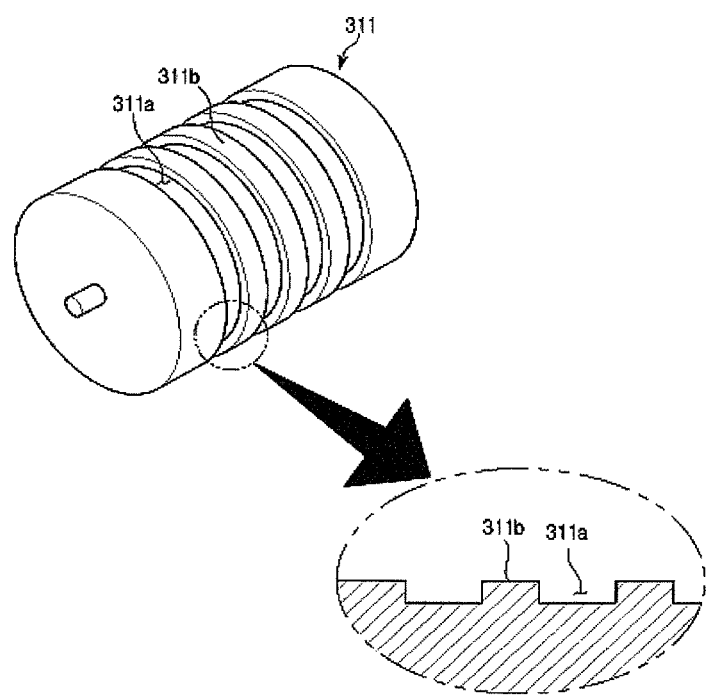
FIG. 20 is a perspective view of a first roller 311 that is used to manufacture the structure of photonic crystals of FIG. 18.
Figure 21:
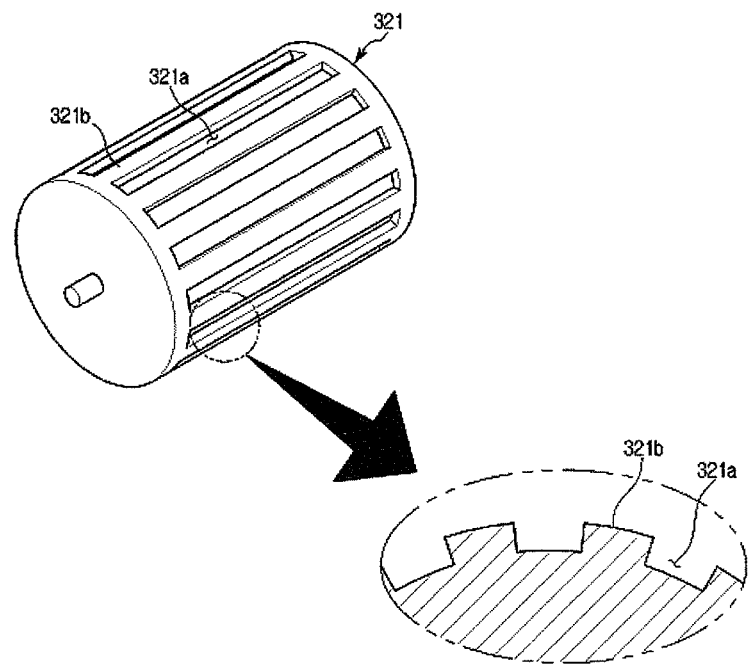
FIG. 21 is a perspective view of a third roller 321 that is used to manufacture the structure of photonic crystals of FIG. 18.

FIG. 20 is a perspective view of a first roller 311 that is used to manufacture the structure of photonic crystals of FIG. 18, and FIG. 21 is a perspective view of a third roller 321 that is used to manufacture the structure of photonic crystals of FIG. 18.

As illustrated in FIGS. 20 and 21, the first roller 311 is mounted to be rotated, and a plurality of basic unit body forming grooves 311a each having a radial, symmetrical cross-section are formed in sides of the first roller 311. A cross-section of each of the basic unit body forming grooves 311a is rectangular, and a plurality of thin film connecting portion forming portions 311b are formed between the basic unit body forming grooves 311a.

The third roller 321 is positioned above a photonic crystal cloning material (basic element layer) that is formed by the lateral basic element layer forming roller portion 210, and a plurality of basic unit body forming grooves 321a each having a lengthwise, symmetrical shape are formed in sides of the third roller 321, and a plurality of thin film connecting portion forming portions 321b are formed between the basic unit body forming grooves 321a.

Each of the basic unit body forming grooves 321a has a rectangular-shaped cross-section.

The other configuration of the first and third rollers that are used to manufacture the structure of photonic crystals of FIG. 18 and the apparatus of FIG. 18 are very similar to those of the apparatus for manufacturing the structure of photonic crystals of FIG. 15. Thus, a detailed description of the same configuration as the apparatus of FIG. 16 will be omitted.

Figure 22:
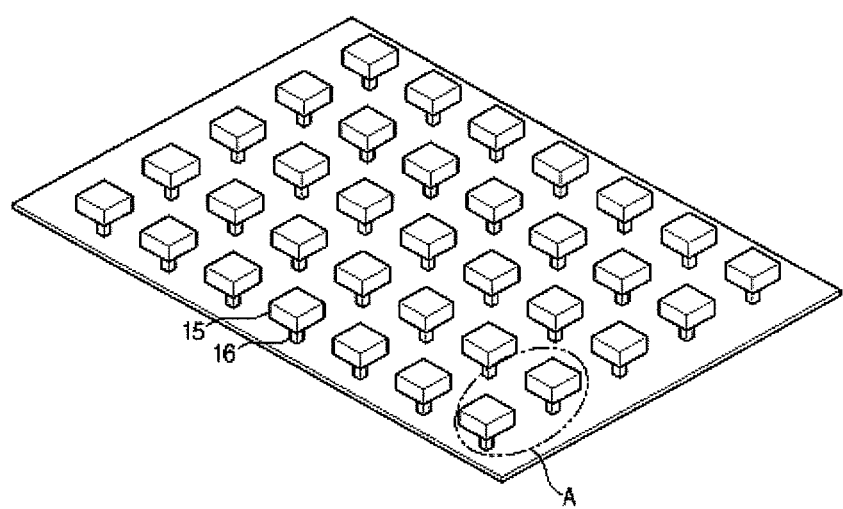
FIG. 22 is a perspective view of basic element layers 10 of a solid structure of photonic crystals according to another embodiment of the present invention.
Figure 23:
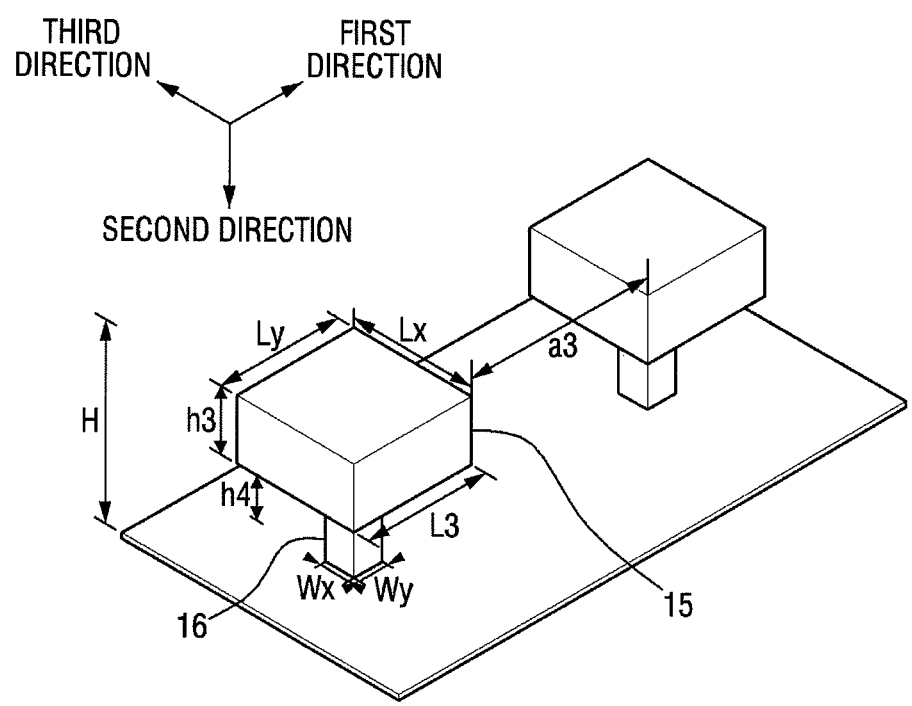
FIG. 23 is an enlarged view of a portion "A" of FIG. 22.
Figure 24:
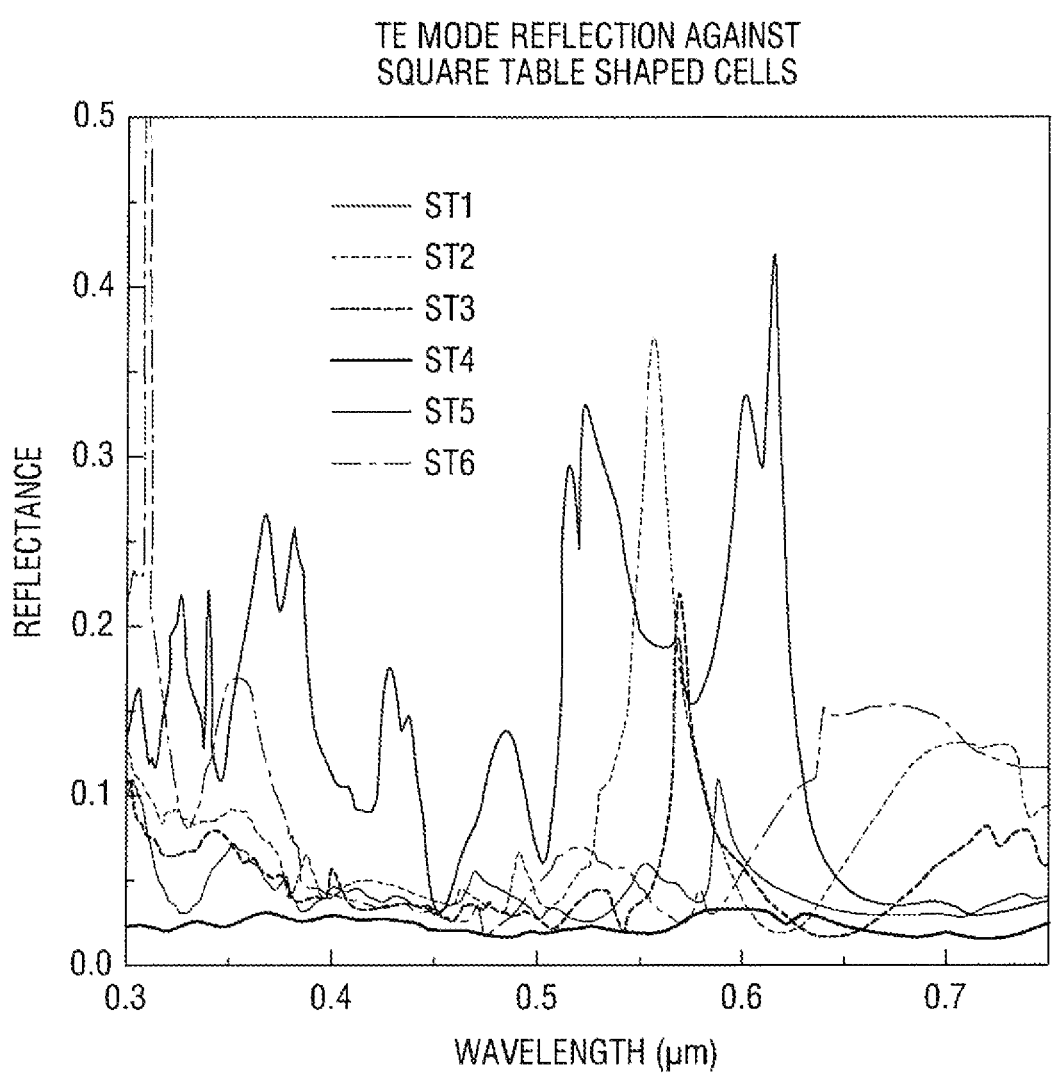
FIG. 24 is a graph showing wavelength (μm) versus reflectance and showing optical characteristic spectrum data of the structure of photonic crystals that is formed by the method of manufacturing the structure of photonic crystals illustrated in FIG. 18.

FIG. 22 is a perspective view of basic element layers 10 of a solid structure of photonic crystals according to another embodiment of the present invention, and FIG. 23 is an enlarged view of a portion "A" of FIG. 22, and FIG. 24 is a graph showing wavelength (μm) versus reflectance and showing optical characteristic spectrum data of the structure of photonic crystals that is formed by the method of manufacturing the structure of photonic crystals illustrated in FIG. 18.

As illustrated in FIG. 22, the basic element layers 10 according to the current embodiment of the present invention are formed by horizontally arranging a plurality of solid basic unit bodies 11 each comprising a hexahedral horizontal portion 15, and a vertical portion 16 that extends from the center of an upper part of the horizontal portion 15 to a lower part thereof. A plurality of basic element layers 10 are stacked vertically and constitute the structure of photonic crystals.

Each of the horizontal portions 15 of the basic element layers 10 has a rectangular parallelepiped shape having a width Lx of 0.5 to 1.5 μm, a length Ly of 0.5 to 1.5 μm and a height h3 of 0.10 to 0.35 μm, and each of the vertical portions 16 has a rectangular column shape having a width Wx of 0.15 to 0.35 μm, a length Wy of 0.15 to 0.7 an and a height h4 of 0.8 to 1.2 μm, and a distance a3 between the basic unit bodies of the basic element layers 10 is 0.5-1.0 μm.

The structure of photonic crystals of FIG. 22 has a peak value of transmittance and reflectance at a predetermined wavelength according to sizes of basic element bodies and represents a predetermined color, as will be described with reference to FIG. 24. Visible rays in all of frequency bands can be represented by changing the sizes of the basic element bodies by using the structure of photonic crystals of FIG. 22.

Specifications of ST1 to ST6 of FIG. 24 are shown in Table 1.

TABLE 1

|  | Lx, Ly | h3 | Wx | Wy |
| --- | --- | --- | --- | --- |
| ST1 | 0.75 | 0.3 | 0.3 | 0.3 |
| ST2 | 0.6 | 0.15 | 0.2 | 0.2 |
| ST3 | 0.6 | 0.15 | 0.2 | 0.6 |
| ST4 | 0.6 | 0.15 | 0.6 | 0.2 |
| ST5 | 0.6 | 0.15 | 0.6 | 0.6 |
| ST6 | 0.6 | 0.15 | 0.2 | 0.6 |

Figure 25:
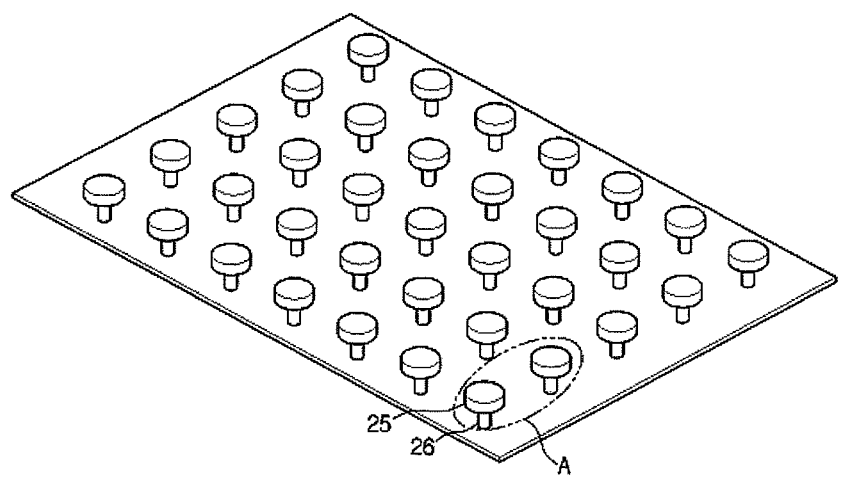
FIG. 25 is a perspective view of basic element layers of a structure of photonic crystals according to another embodiment of the present invention.
Figure 26:
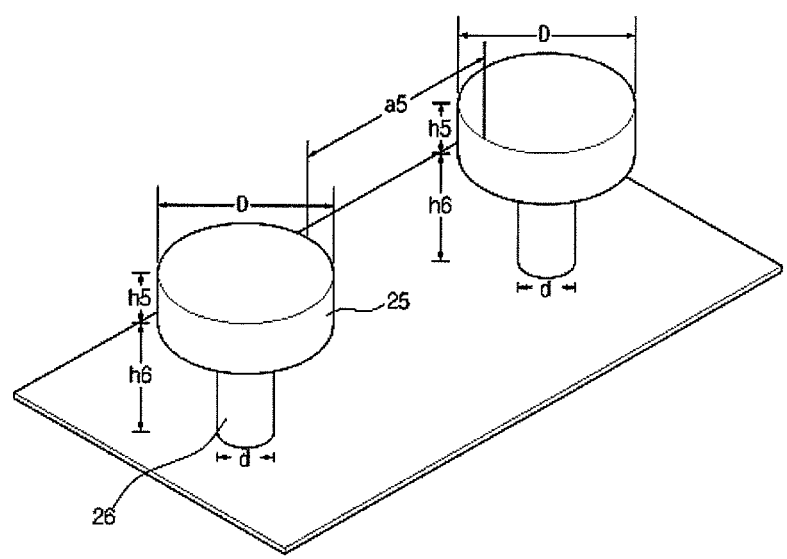
FIG. 26 is an enlarged view of a portion "A" of FIG. 25.

FIG. 25 is a perspective view of basic element layers of a structure of photonic crystals according to another embodiment of the present invention, and FIG. 26 is an enlarged view of a portion "A" of FIG. 25.

The current embodiment of FIG. 25 is modification of the shape of basic unit bodies. The basic element layers of FIG. 25 are formed by horizontally arranging a plurality of basic unit bodies each comprising a horizontal portion 25 and a vertical portion 26.

The horizontal portion 25 is circular plate shaped, and the vertical portion 26 extends from the center to a lower part of the horizontal portion 25.

The horizontal portion 25 of each of the basic unit bodies has a circular plate shape having a diameter D of 0.5 to 1.5 μm and a height h5 of 0.10 to 0.35 μm. The vertical portion 26 thereof has a circular cylinder shape having a diameter d of 0.15 to 0.35 μm and a height h6 of 0.8 to 1.2 μm, and a distance a5 between the basic unit bodies of the basic element layers is 0.5 to 1.0 μm.

The basic unit bodies of FIG. 25 has an advantage that the horizontal portion 25 has the circular plate shape and the basic unit bodies can be easily processed during a nanoimprint process.

Figure 27:
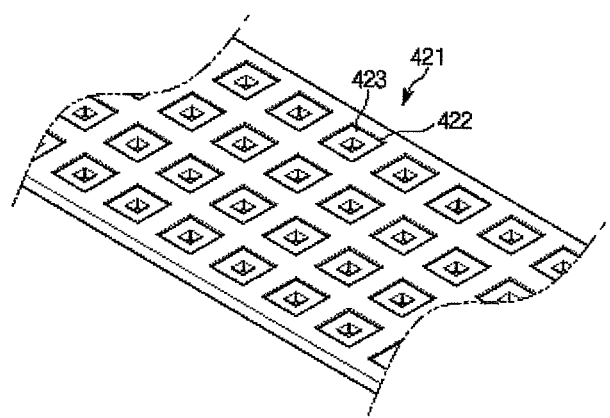
FIG. 27 is a perspective view of a flat mold that is used to manufacture the structure of photonic crystals of FIG. 25.
Figure 28:
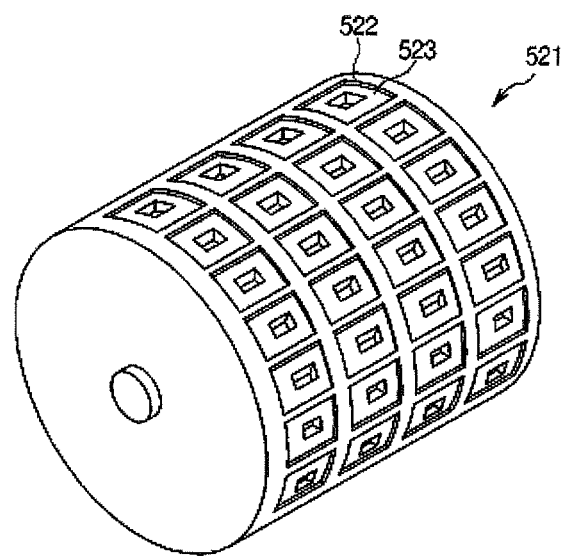
FIG. 28 is a perspective view of a mold having a roller shape that is used to manufacture the structure of photonic crystals of FIGS. 25.

FIGS. 27 and 28 are perspective views of molds that are used to manufacture the structure of photonic crystals of FIG. 22.

Basic element layers of the structure of photonic crystals may be formed by forming molds illustrated in FIGS. 27 and 28.

FIG. 27 illustrates a flat mold 421, and FIG. 28 illustrates a forming roller mold 521 having a roller shape.

A plurality of grooves 422 are formed in one side of the flat mold 421 of FIG. 27. The plurality of grooves 422 are formed in such a way that a short protrusion 423 is formed at outer edges of the grooves 422 and each of the grooves 422 has a "T"-shaped cross-section.

The forming roller mold 521 having the roller shape of FIG. 28 is formed in a cylindrical shape. A plurality of forming grooves 522 are formed in their cylindrical outer circumferences. The plurality of forming grooves 522 are formed in such a way that a short protrusion 523 is formed in the outer edges of the forming grooves 522 and each of the grooves 522 has a "T"-shaped cross-section.

The solid basic element layers 10 of FIG. 22 are formed by using the forming molds of FIGS. 27 and 28. A detailed forming process thereof is the same as that of FIG. 3 described above.

The solid basic element layers of FIG. 25 may be formed by changing the shapes of the forming grooves of the forming molds of FIGS. 27 and 28.

Figure 29:
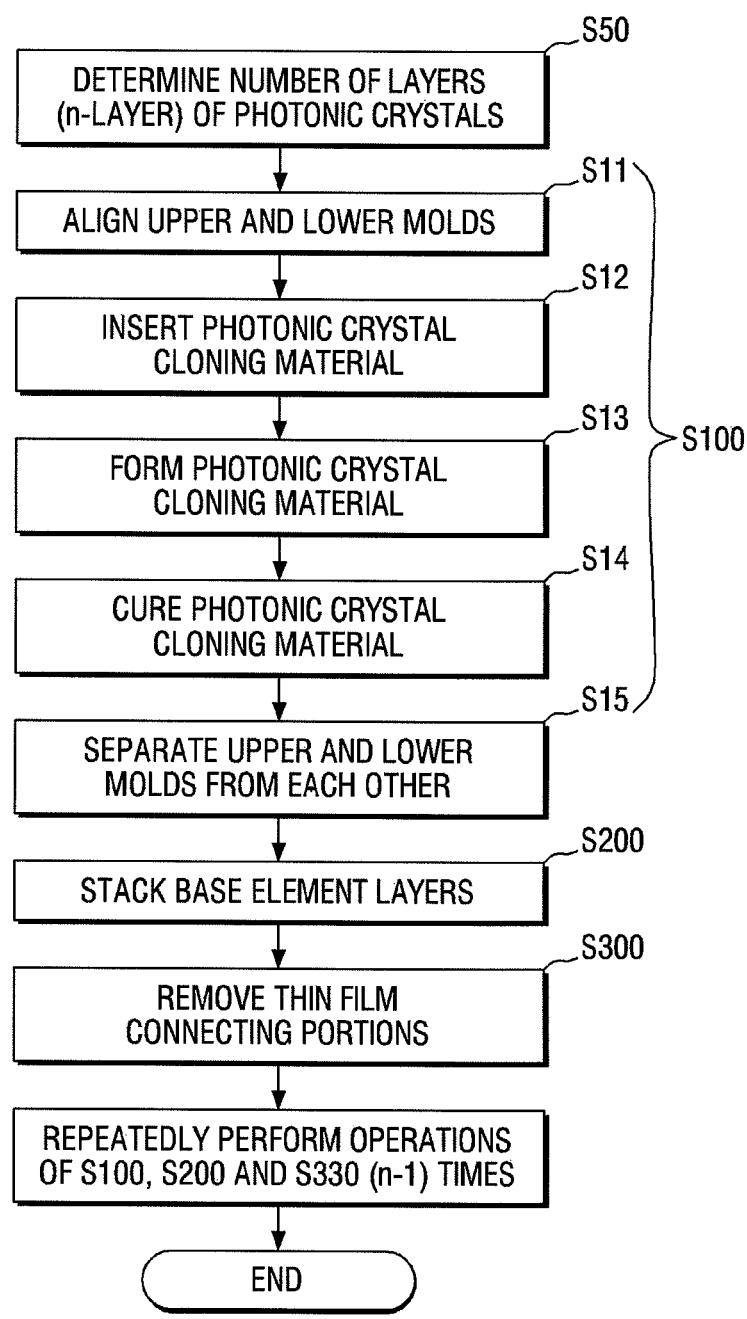
FIG. 29 is a flowchart illustrating a method of manufacturing a structure of photonic crystals according to another embodiment of the present invention.

FIG. 29 is a flowchart illustrating a method of manufacturing a structure of photonic crystals according to another embodiment of the present invention.

Referring to FIG. 29, the method of manufacturing the structure of photonic crystals according to the current embodiment of the present invention comprises designing and determining the number of layers (n-layer) of a structure of photonic crystals (S50); forming basic element layers by using a nanoimprinting method, the basic element layers comprising a plurality of basic unit bodies each having a symmetrical cross-section and a plurality of thin film connecting portions connecting the basic unit bodies one another (S100); sequentially stacking the basic element layers (S200); and removing the thin film connecting portions by etching (S300). The structure of photonic crystals is formed by repeatedly performing the forming of the basic element layers (S100), the stacking of the basic element layers (S200), and the removing of the thin film connecting portions (n-1) times (S300).

In the current embodiment of FIG. 29, the number of repetition (n times) is pre-set, unlike in the embodiment of FIG. 3. In addition, the forming of the basic element layers (S100), the stacking of the basic element layers (S200), and the removing of the thin film connecting portions (S300) are simply performed according to the number of repetition.

As a result, the current embodiment of FIG. 29 has an advantage that an additional operation such as determining whether a structure of photonic crystals is completed is omitted such that production processes and an apparatus thereof are simplified and a process time can be reduced.

Figure 30:
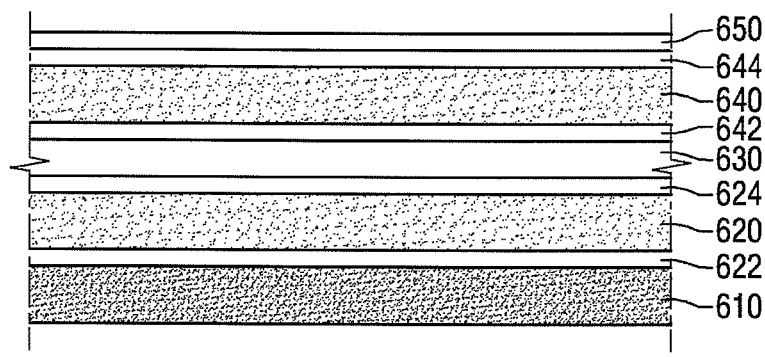
FIG. 30 is a cross-sectional view of a silicon solar cell according to an embodiment of the present invention.

Hereinafter, a silicon solar cell according to an embodiment of the present invention will be described with reference to FIG. 30. FIG. 30 is a cross-sectional view of a silicon solar cell according to an embodiment of the present invention.

Referring to FIG. 30, the silicon solar cell according to an embodiment of the present invention may include a back sheet 610, a first silicon layer 620 formed on the back sheet 610, and a second silicon layer 640 formed on the second silicon layer 640. A layer 630 of structure of photonic crystals is formed between the first silicon layer 620 and the second silicon layer 640.

The back sheet 610 may be made of polyethylene-terephthalate (PET), polyvinyl fluoride (PVF), or a film having PET and PVF sequentially stacked. Alternatively, polyester r acryl may be used for the back sheet 610. However, the material of the back sheet 610 is not limited thereto, and various materials may be used by those of ordinary skill in the art within the scope of knowledge that can be easily acquired.

The first silicon layer 620 and the second silicon layer 640 may absorb sunlight at different wavelengths. For example, the first silicon layer 620 may be a microcrystalline silicon layer, and the second silicon layer 640 may be an amorphous silicon layer, but not limited thereto. The first silicon layer 620 may be an amorphous silicon layer, and the second silicon layer 640 may be a microcrystalline silicon layer. That is to say, the first silicon layer 620 and the second silicon layer 640 may be formed in a variety of combinations as long as wavelengths of sunlight absorbed thereby are different from each other.

In the following description, for the sake of convenient description, it is assumed that the first silicon layer 620 is a microcrystalline silicon layer and the second silicon layer 640 is an amorphous silicon layer. That is to say, in the following description, assuming that the first silicon layer 620 is a microcrystalline silicon layer and the second silicon layer 640 is an amorphous silicon layer, the amorphous silicon layer 640 may be, for example, a silicon layer doped with an n-type impurity, and the microcrystalline silicon layer 620 may be, for example, a silicon layer doped with a p-type impurity and an n-type impurity. However, the materials of the first silicon layer 620 and the second silicon layer 640 are not limited thereto, and various materials may be used by those of ordinary skill in the art within the scope of knowledge that can be easily acquired.

The amorphous silicon layer 640, into which sunlight is first incident, absorbs light of a short wavelength, and the microcrystalline silicon layer 620 absorbs light of a long wavelength, which is not absorbed by the amorphous silicon layer 640. Thus, the solar cell formed by stacking the microcrystalline silicon layer 620 and the amorphous silicon layer 640 may absorb sunlight of various wavelengths.

The layer 630 of structure of photonic crystals may be formed between the amorphous silicon layer 640 and the microcrystalline silicon layer 620. The layer 630 of structure of photonic crystals may be formed by the method shown in FIG. 4. The layer 630 of structure of photonic crystals includes basic element layers 10 each having a plurality of basic unit bodies 11 having "T"-shaped cross sections repeatedly arranged in a first direction and spaced a predetermined distance apart from each other. As shown in FIG. 5, each of the basic unit bodies 11 has a horizontal portion extending in the first direction, and a vertical portion extending from a middle of the horizontal portion in a second direction perpendicular to the first direction first direction. Here, a width of the vertical portion in the first direction is smaller than a width of the horizontal portion in the first direction, and the width of the vertical portion in the first direction is constant.

The layer 630 of structure of photonic crystals may be formed by stacking a plurality of the basic element layer 10 in the second direction. As shown in FIGS. 4 and 10 to 14, the layer 630 of structure of photonic crystals may be stacked in various manners.

As shown in FIGS. 22 and 23 or FIGS. 25 and 26, the layer 630 of structure of photonic crystals used in the silicon solar cell according to an embodiment may be formed in a matrix type.

The layer 630 of structure of photonic crystals interposed between the amorphous silicon layer 640 and the microcrystalline silicon layer 620 selectively reflects the light of a wavelength absorbed by the microcrystalline silicon layer 620. Referring to FIG. 6, in a case where each of the basic unit bodies 11 has the size of w1=1.0 μm, H=1.0 μm, and w2=0.2 μm and a distance 'a' between the basic unit bodies is 0.4 μm, a particular wavelength (greenish yellow of approximately 0.58 μm) is reflected when a single layer or two layers are stacked. That is to say, in the solar cell according to an embodiment, the reflected wavelength can be controlled by adjusting parameters of various components of the basic unit body 11 of the layer 630 of structure of photonic crystals. Therefore, the light of the wavelength absorbed by the amorphous silicon layer 640 may be selectively reflected, which can be considerably contributable to improved efficiency of the solar cell according to an embodiment.

Meanwhile, transparent conductive oxide (TCO) layers 622, 624, 642 and 644 may be formed on top and bottom portions of the amorphous silicon layer 640 and the microcrystalline silicon layer 620. The transparent conductive oxide layers 622, 624, 642 and 644 may be made of, for example, indium tin oxide (ITO), zinc oxide (ZnO), titanium dioxide ($TiO_2$), or tin dioxide ($SnO_2$).

An anti-reflective layer 650 may be formed on the transparent conductive oxide layer 644 formed on a region into which the sunlight is first incident. The anti-reflective layer 650 may be, for example, a transparent insulation layer made of silicon oxide ($SiO_2$) or silicon nitride ($SiN_x$), but not limited thereto.

In the silicon solar cell according to an embodiment of the present invention, the layer 630 of structure of photonic crystals is formed between the first silicon layer 620 and the second silicon layer having different wavelengths absorbing sunlight. Therefore, in the light having a wavelength absorbed by the second silicon layer 640 into which sunlight is first incident, the light that is transmitted through the second silicon layer 640 without being absorbed may be reflected at the layer 630 of structure of photonic crystals and then absorbed by the second silicon layer 640. Meanwhile, in the silicon solar cell according to an embodiment of the present invention, the wavelength of sunlight absorbed by the layer 630 of structure of photonic crystals can be controlled by adjusting parameters of various components of the basic unit bodies 11 constituting the layer 630 of structure of photonic crystals. Therefore, the silicon solar cell is easily manufactured and has improved efficiency.

Meanwhile, in the silicon solar cell according to an embodiment of the present invention, the silicon solar cell may be formed to have a stacked structure having the amorphous silicon layer 640 and the microcrystalline silicon layer 620. The layer 630 of structure of photonic crystals is formed to have the stacked structure having the amorphous silicon layer 640 and the microcrystalline silicon layer 620 which are relatively low-priced without using a relatively high-priced crystalline silicon layer, thereby manufacturing a highly efficient silicon solar cell at a markedly low manufacturing cost. However, the embodiment of the silicon solar cell having the stacked structure of the amorphous silicon layer 640 and the microcrystalline silicon layer 620 should not be construed as limited to the particular structure described herein and a silicon solar cell using a crystalline silicon layer may also be within the spirit and scope of the invention.

Figure 31:
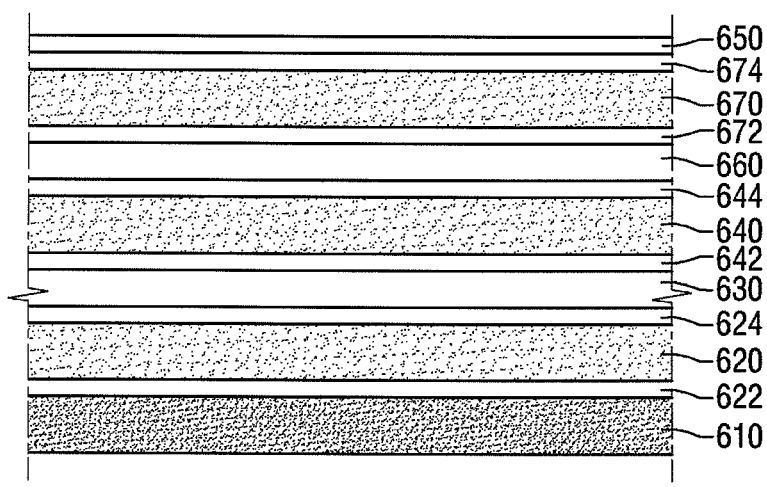
FIG. 31 is a cross-sectional view of a silicon solar cell according to another embodiment of the present invention.

FIG. 31 is a cross-sectional view of a silicon solar cell according to another embodiment of the present invention.

The silicon solar cell according to this embodiment of the present invention shown in FIG. 31 is different from the silicon solar cell according to this embodiment shown in FIG. 30 in that a third silicon layer 670 is further stacked on a second silicon layer 640, and a layer 630 of structure of photonic crystals is further formed between the second silicon layer 640 and the third silicon layer 670.

Here, the first silicon layer 620, the second silicon layer 640 and the third silicon layer 670 may be silicon layers absorbing sunlight at different wavelengths. Alternatively, two layers of absorbing sunlight of the same wavelength may be formed such that the first silicon layer 620 and the second silicon layer 640 absorb sunlight of the same wavelength, or the second silicon layer 640 and the third silicon layer 670 absorb sunlight of the same wavelength, thereby further improving the sunlight absorption efficiency.

Meanwhile, a first layer 630 of structure of photonic crystals formed between the first silicon layer 620 and the second silicon layer 640 may be designed to reflect sunlight of a wavelength absorbed by the second silicon layer 640, and a second layer 630 of structure of photonic crystals formed between the second silicon layer 640 and the third silicon layer 670 may be designed to reflect sunlight of a wavelength absorbed by the third silicon layer 670. Here, the wavelengths of light absorbed by the first and second layers 630 of structure of photonic crystals may be controlled by adjusting parameters of various components of basic unit bodies 11 of the respective layers 630 of structure of photonic crystals.

Although not shown, in silicon solar cells according to alternative embodiments of the present invention, four or more silicon layers may be stacked and a layer of structure of photonic crystals may be interposed between each of the silicon layers.

Figure 32:
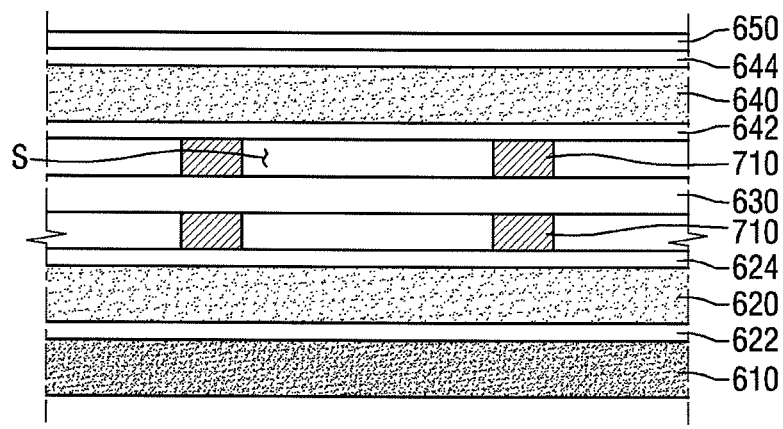
FIG. 32 is a cross-sectional view of a silicon solar cell according to another embodiment of the present invention.

Hereinafter, a silicon solar cell according to another embodiment of the present invention will be described with reference to FIG. 32. FIG. 32 is a cross-sectional view of a silicon solar cell according to another embodiment of the present invention.

Referring to FIG. 32, the silicon solar cell according to another embodiment of the present invention may include a back sheet 610, a first silicon layer 620 formed on the back sheet 610, and a second silicon layer 640 formed on the second silicon layer 640. In addition, a reflective filter 630 selectively reflecting sunlight of a predetermined wavelength is provided between the first silicon layer 620 and the second silicon layer 640. In addition, spacers 710 are formed between the first silicon layer 620 and the reflective filter 630 and between the second silicon layer 640 and the reflective filter 630, providing for spaces between each of the components.

Since the back sheet 610, the first silicon layer 620 and the second silicon layer 640 are substantially the same as those in the previous embodiment, the description thereof will be omitted.

The reflective filter 630 selectively reflects sunlight of a predetermined wavelength. In detail, the reflective filter 630 selectively reflects the light of a wavelength absorbed by the second silicon layer 640 into which the light is first incident. The reflective filter 630 may be formed of a transparent conductive oxide layer made of, for example, at least one selected from the group consisting of ITO, ZnO, $TiO_2$, and $SnO_2$, and combinations thereof. In addition, the reflective filter 630 may be a layer of structure of photonic crystals used in the silicon solar cell according to the previous embodiment.

Meanwhile, transparent conductive oxide layers 622, 624, 642 and 644 may be formed on top and bottom portions of the first silicon layer 620 and the second silicon layer 640, and an anti-reflective layer 650 may be formed on the transparent conductive oxide layer 644 formed on a region into which the sunlight is first incident. Since the transparent conductive oxide layers 622, 624, 642 and 644 and the anti-reflective layer 650 are substantially the same as those in the previous embodiment, the description thereof will be omitted.

In addition, spacers 710 are formed between the first silicon layer 620 and the reflective filter 630 and between the second silicon layer 640 and the reflective filter 630, providing for spaces 's' between each of the components. The spacers 710 are formed such that the first silicon layer 620 and the second silicon layer 640 are spaced apart from each other by the reflective filter 630 interposed therebetween.

Figure 33:
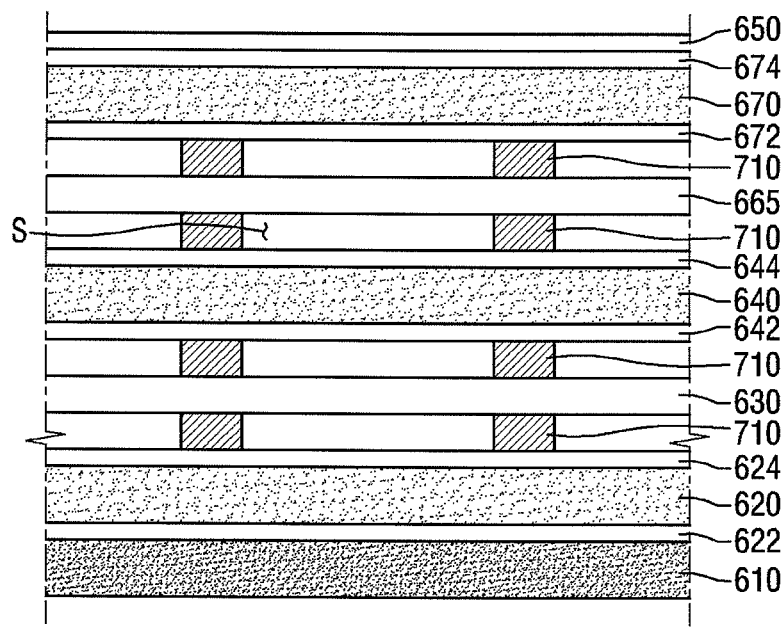
FIG. 33 is a cross-sectional view of a silicon solar cell according to another embodiment of the present invention.

FIG. 33 is a cross-sectional view of a silicon solar cell according to another embodiment of the present invention.

The silicon solar cell according to this embodiment of the present invention shown in FIG. 33 is different from the silicon solar cell according to this embodiment shown in FIG. 32 in that a third silicon layer 670 is further stacked on a second silicon layer 640, and a reflective filter 630 is further formed between the second silicon layer 640 and the third silicon layer 670.

Here, the first silicon layer 620, the second silicon layer 640 and the third silicon layer 670 may be silicon layers absorbing sunlight at different wavelengths. Alternatively, two layers of absorbing sunlight of the same wavelength may be formed such that the first silicon layer 620 and the second silicon layer 640 absorb sunlight of the same wavelength, or the second silicon layer 640 and the third silicon layer 670 absorb sunlight of the same wavelength, thereby further improving the sunlight absorption efficiency.

Meanwhile, a first layer 630 of structure of photonic crystals formed between the first reflective filter 630 and the second silicon layer 640 may be designed to reflect sunlight of a wavelength absorbed by the second silicon layer 640, and a second reflective filter 630 formed between the second silicon layer 640 and the third silicon layer 670 may be designed to reflect sunlight of a wavelength absorbed by the third silicon layer 670. Here, the wavelengths of light absorbed by first and second layers 630 of structure of photonic crystals may be controlled by varying materials forming the reflective filter 630. If the reflective filter 630 is a layer of structure of photonic crystals, the wavelengths of light absorbed by first and second layers 630 of structure of photonic crystals may be controlled by adjusting parameters of various components of basic unit bodies 11 constituting the layer of structure of photonic crystals or by adjusting a distance between basic element layers or arrangement of the basic element layers.

Although not shown, in silicon solar cells according to alternative embodiments of the present invention, four or more silicon layers may be stacked and a reflective filter may be interposed between each of the silicon layers.

FIGS. 34 through 38 are partially perspective views illustrating various embodiments of spacers used in the silicon solar cells illustrated in FIGS. 9 and 11.

Figure 34:
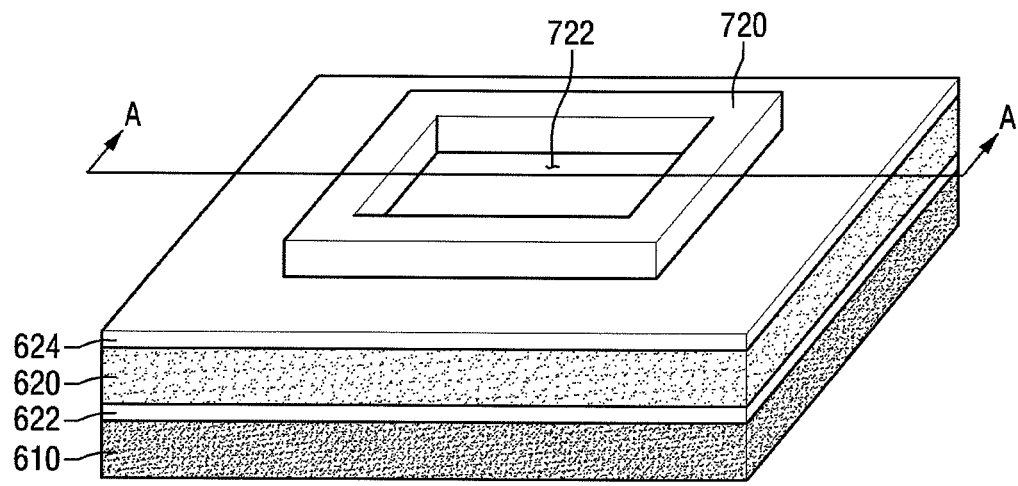
FIGS. 34 through 38 are partially perspective views illustrating various embodiments of spacers used in the silicon solar cells illustrated in FIGS. 9 and 11.

Referring to FIG. 34, in order to distinctly show a structure of a first spacer 720, only the in the silicon solar cell according to the embodiments shown in FIGS. 32 and 33, only a back sheet 610, a first silicon layer 620 and transparent conductive oxide layers 622 and 624 formed on top and bottom surfaces of the first silicon layer 620 are illustrated and the other components are not illustrated for purposes of brevity. The silicon solar cells shown in FIGS. 32 and 33 are illustrated by cross sectional views taken in the 'A' direction of FIG. 34.

While FIG. 34 illustrates a first spacer 720 interposed between the first silicon layer 620 and the reflective filter 630 for the sake of convenient description, any one of a plurality of spacers 710 included in the silicon solar cells shown in FIGS. 32 and 33 may be interposed between the first silicon layer 620 and the reflective filter 630.

Referring to FIG. 34, the first spacer 720 used in the silicon solar cells according to embodiments of the present invention includes an outer support portion 724 surrounding a closed internal space 722 formed therein. When the first spacer 720 is employed to the silicon solar cells shown in FIGS. 32 and 33, a space 's' may be formed between the reflective filter 635 and the transparent conductive oxide layer 624 by the outer support portion 724. Here, the space 's' is a space ranging from outer side surfaces of the closed space 722 and the outer support portion 724 to outer ends of the reflective filter 635 and the transparent conductive oxide layer 624.

Figure 35:
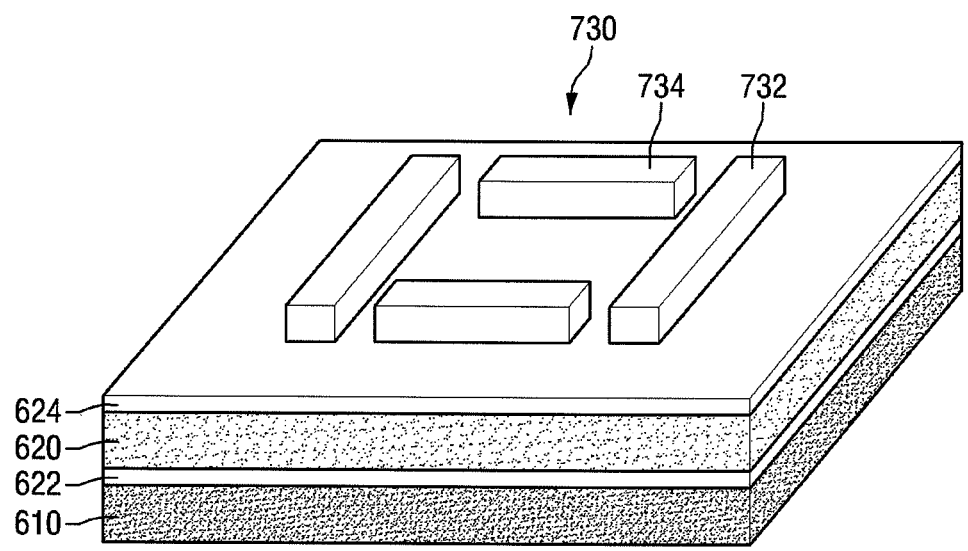

Referring to FIG. 35, a second spacer 730 used in the silicon solar cells according to embodiments of the present invention may include first sub pacers 732 extending in parallel in one direction to be spaced apart from each other and second sub spacers 734 extending in parallel in the other direction perpendicular to the one direction to be spaced apart from each other.

Figure 36:
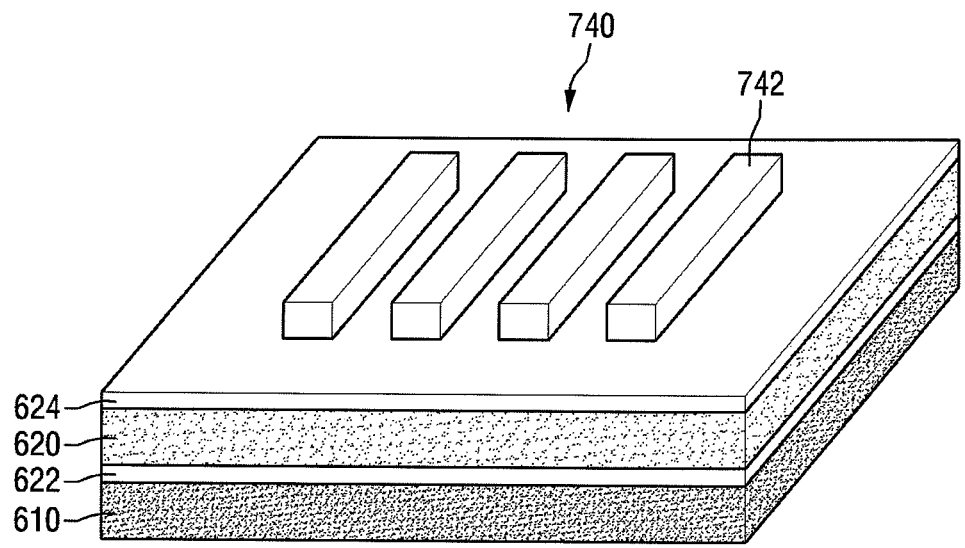

Referring to FIG. 36, a third spacer 740 used in the silicon solar cells according to embodiments of the present invention may include a plurality of third sub pacers 742 extending in parallel in one direction to be spaced apart from each other.

Figure 37:
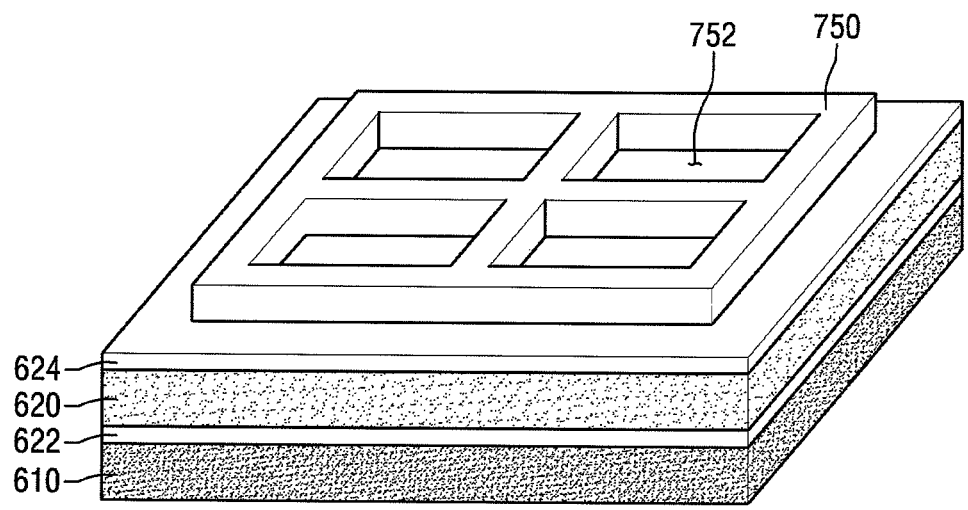

Referring to FIG. 37, a fourth spacer 750 used in the silicon solar cells according to embodiments of the present invention may be formed in a matrix type having four closed spaces 752 formed therein.

Figure 38:
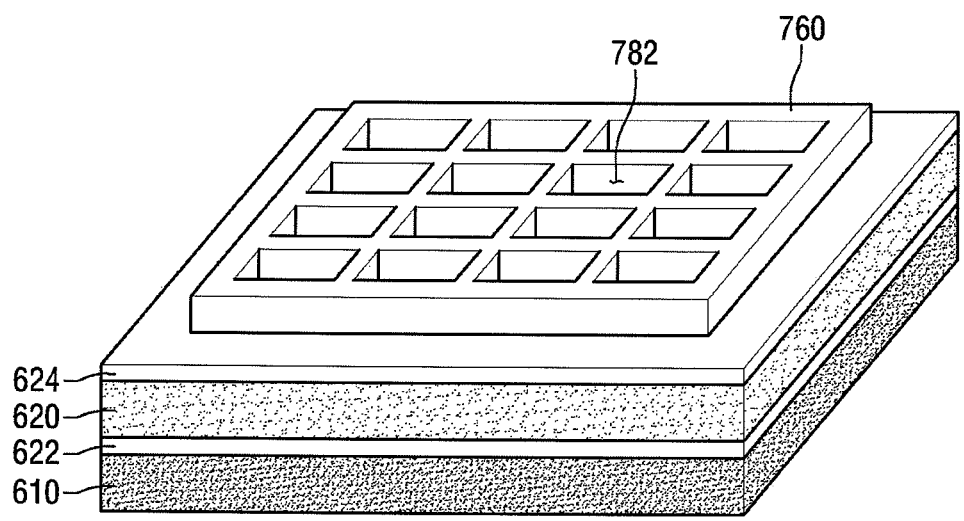

Referring to FIG. 38, a fifth spacer 760 used in the silicon solar cells according to embodiments of the present invention may be formed in a matrix type having sixteen closed spaces 782 formed therein.

As described above, the first to fifth spacers 720, 730, 740, 750 and 760 shown in FIGS. 34 to 38 may be at least one of the plurality of spacers 710 included in the silicon solar cells shown in FIGS. 32 and 33. In addition, different spacers selected among the first to fifth spacers 720, 730, 740, 750 and 760 may be applied to the plurality of spacers 710 included in the silicon solar cell shown in FIG. 32 or 33.

According to the silicon solar cells of the present invention shown in FIGS. 30 to 33, spacers are provided between one or more components to form spaces in the silicon solar cells. Therefore, since air passes through the silicon solar cells shown in FIGS. 30 to 33, heat can be easily emitted to the outside, thereby improving heat characteristics of the silicon solar cells.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A silicon solar cell comprising:
a first silicon layer that absorbing sunlight;
a first layer of a structure of photonic crystals formed on the first silicon layer; and
a second silicon layer formed on the first layer of a structure of photonic crystals and absorbing sunlight,
wherein the first silicon layer and the second silicon layer absorb sunlight at different wavelengths and the first layer of structure of photonic crystals selectively reflects light of a wavelength absorbed by the second silicon layer.

2. The silicon solar cell of claim 1, wherein the first silicon layer is a microcrystalline silicon layer and the second silicon layer is an amorphous silicon layer.

3. The silicon solar cell of claim 1, wherein the first layer of structure of photonic crystals includes basic element layers each comprising a plurality of basic unit bodies having "T"-shaped cross sections repeatedly arranged in a first direction and spaced a predetermined distance apart from each other;
each of the basic unit bodies has a horizontal portion extending in the first direction, and a vertical portion extending from the center of the horizontal portion in a second direction perpendicular to the first direction; and
a width of the vertical portion in the first direction is smaller than a width of the horizontal portion in the first direction, and the width of the vertical portion in the first direction is constant.

4. The silicon solar cell of claim 1, further comprising a transparent conductive oxide layer interposed between each of the respective components.

5. The silicon solar cell of claim 1, further comprising a first spacer interposed between the first silicon layer and the first layer of structure of photonic crystals and contacting portions of the first silicon layer and the first layer of structure of photonic crystals, the first spacer providing for a space between the first silicon layer and the first layer of structure of photonic crystals.

6. The silicon solar cell of claim 5, further comprising a second spacer interposed between the second silicon layer and the first layer of structure of photonic crystals and contacting portions of the second silicon layer and the first layer of structure of photonic crystals, the second spacer providing for a space between the second silicon layer and the first layer of structure of photonic crystals.

7. The silicon solar cell of claim 6, wherein each of the first and second spacers include a plurality of first and second spacers.

8. The silicon solar cell of claim 7, wherein each of the first and second spacers includes a plurality of sub spacers spaced apart from each other in one direction and extending in parallel to each other.

9. The silicon solar cell of claim 6, wherein at least one of the first and second spacers includes at least one space and formed in a matrix type.

10. The silicon solar cell of claim 1, further comprising:
a third silicon layer formed on the second silicon layer and absorbing sunlight; and
a second layer of structure of photonic crystals interposed between the second silicon layer and the third silicon layer and selectively reflecting the light of a wavelength absorbed by the third silicon layer.

11. The silicon solar cell of claim 10, further comprising a plurality of spacers interposed between each of the respective components and some portions contacting the respective components, the plurality of spacers providing for spaces between each of the respective components.

12. A silicon solar cell comprising:
a plurality of silicon layers sequentially stacked;
at least one reflective filter disposed between each of the plurality of silicon layers and selectively reflecting the light of a predetermined wavelength; and a plurality of spacers interposed between each of the plurality of silicon layers and components including the at least one reflective filter, the plurality of spacers providing for spaces between each of the respective components.

13. The silicon solar cell of claim 12, further comprising a transparent conductive oxide layer formed on a top surface, a bottom surface, or top and bottom surfaces of at least one of the plurality of silicon layers.

14. The silicon solar cell of claim 12, wherein at least one of the plurality of spacers includes an outer support portion surrounding an internal space.

15. The silicon solar cell of claim 14, wherein at least one of the plurality of spacers includes at least one space dividing unit that divides the internal space of the outer support unit.

16. The silicon solar cell of claim 14, wherein at least one of the plurality of spacers is formed in a matrix type.

17. The silicon solar cell of claim 12, wherein at least one of the plurality of spacers includes a plurality of sub spacers spaced apart from each other in one direction and extending in parallel to each other.

18. The silicon solar cell of claim 12, wherein the plurality of silicon layers include a first silicon layer and a second silicon layer absorbing sunlight at different wavelengths.

19. The silicon solar cell of claim 18, wherein the first silicon layer is a polysilicon layer and the second silicon layer is an amorphous silicon layer.

20. The silicon solar cell of claim 12, wherein the at least one reflective filter is a layer of structure of photonic crystals.

21. The silicon solar cell of claim 20, wherein the layer of structure of photonic crystals includes basic element layers each comprising a plurality of basic unit bodies having "T"-shaped cross sections repeatedly arranged in a first direction and spaced a predetermined distance apart from each other;

each of the basic unit bodies has a horizontal portion extending in the first direction, and a vertical portion extending from the center of the horizontal portion in a second direction perpendicular to the first direction; and a width of the vertical portion in the first direction is smaller than a width of the horizontal portion in the first direction, and the width of the vertical portion in the first direction is constant.

22. The silicon solar cell of claim 12, wherein the at least one reflective filter is a transparent conductive oxide layer.

* * * * *